United States Patent [19]
Miyajima

[11] Patent Number: 5,984,505
[45] Date of Patent: Nov. 16, 1999

[54] BLOCK EXPOSURE OF SEMICONDUCTOR WAFER

[75] Inventor: Masaaki Miyajima, Kasugai, Japan

[73] Assignee: Fujitsu Limited, Kawasaki, Japan

[21] Appl. No.: 08/816,685

[22] Filed: Mar. 13, 1997

[30] Foreign Application Priority Data

Mar. 19, 1996 [JP] Japan .................................... 8-063096

[51] Int. Cl.⁶ .................................................. G06F 19/00
[52] U.S. Cl. ............................... 364/468.28; 395/500.2; 395/500.22; 250/492.2
[58] Field of Search ..................... 364/468.28; 438/106, 438/107, 128, 129; 206/710; 211/41.18; 250/492.2; 395/500.2, 500.21, 500.22

[56] References Cited

U.S. PATENT DOCUMENTS

| | | | |
|---|---|---|---|
| 4,531,060 | 7/1985 | Suwa et al. | 250/548 |
| 4,789,945 | 12/1988 | Nijima | 364/490 |
| 5,177,635 | 1/1993 | Yamada | 250/492.2 |

*Primary Examiner*—William Grant
*Assistant Examiner*—Steven R. Garland
*Attorney, Agent, or Firm*—Staas & Halsey LLP

[57] ABSTRACT

Improved block exposure techniques for a semiconductor wafer that use a block mask with an exposure pattern separated into blocks are disclosed. Each block comprises a plurality of block elements having parts of the exposure pattern and installed on the block mask. A plurality of block elements having predetermined patterns are extracted from the exposure pattern. Each of the predetermined patterns is present in at least one partial area of an associated one of the block elements. A combination of a plurality of extracted block elements having patterns arrangeable in a single block is specified based on pattern present areas of the individual extracted block elements. The patterns of combined extracted block elements are laid out in a single block and an irradiation mode of that block is changed from a full irradiation mode to a partial irradiation mode.

15 Claims, 30 Drawing Sheets

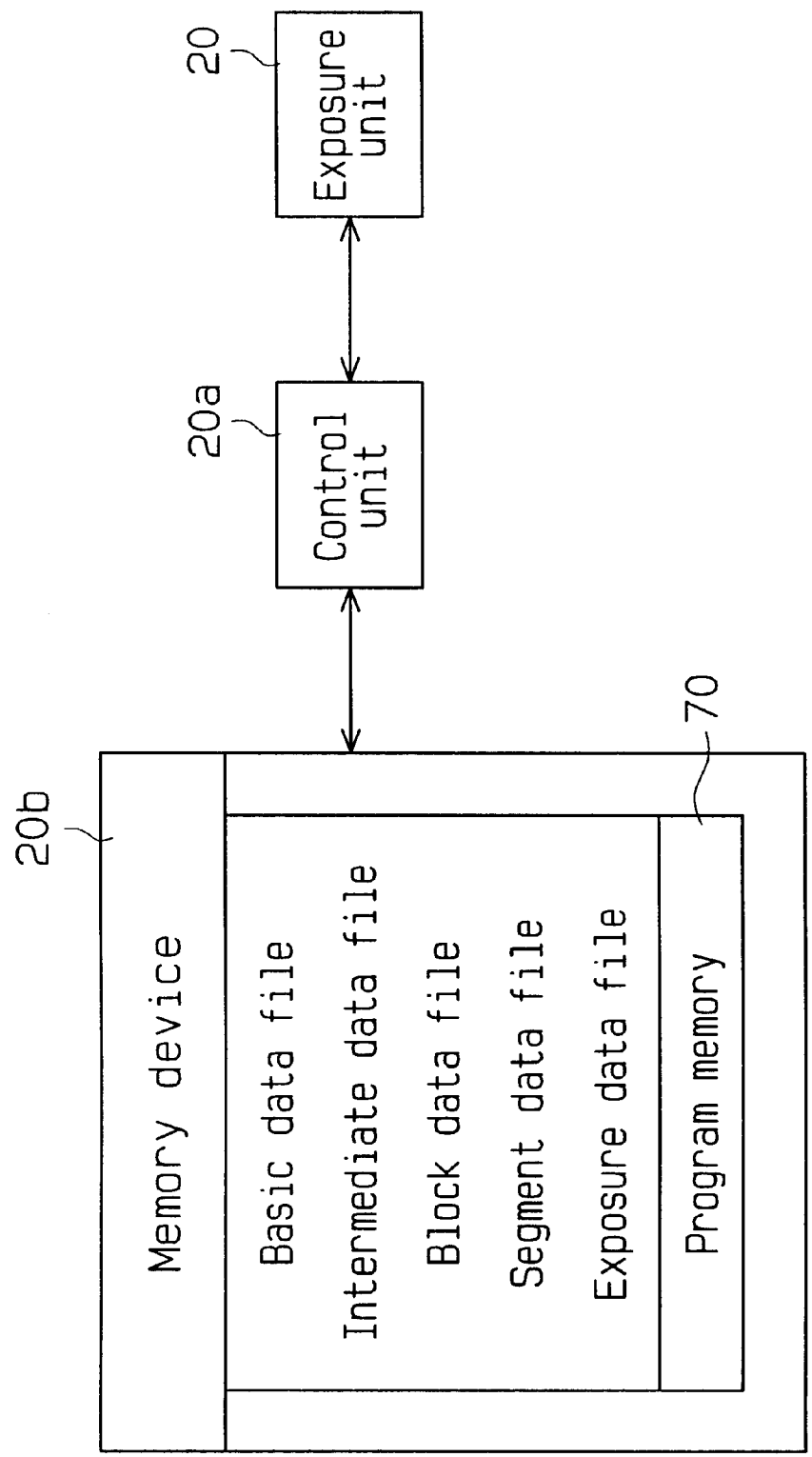

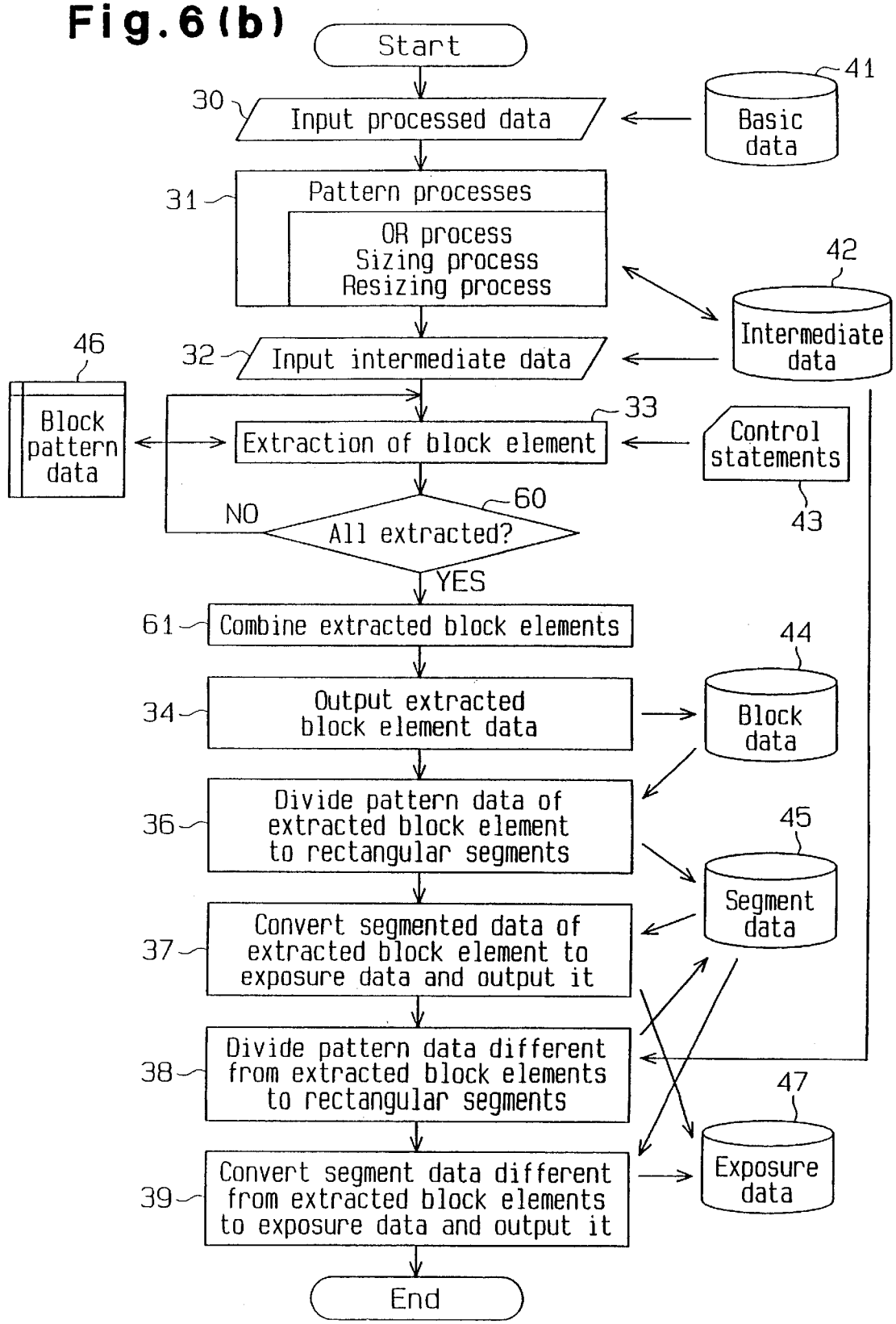

Fig.7(a)
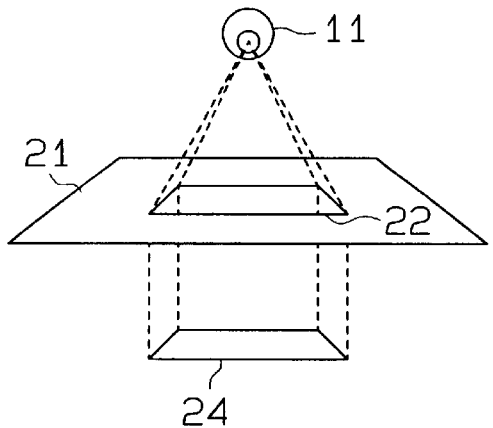
Fig.7(b)
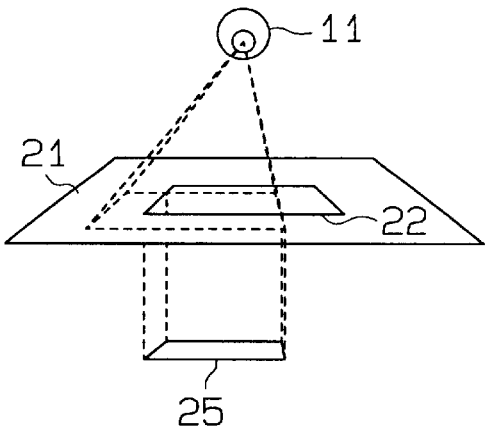
Fig.7(c)
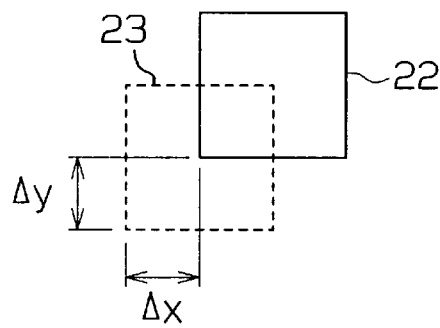
Fig.7(d)
| Full irradiation mode |
|---|
| Block number |
| Block pattern data |
| Block number |
| Block pattern data |
| Partial irradiation mode |
|---|
| Block number |
| Offset amount Δx  Offset amount Δy |
| Block number |
| Offset amount Δx  Offset amount Δy |

Fig.15(a)

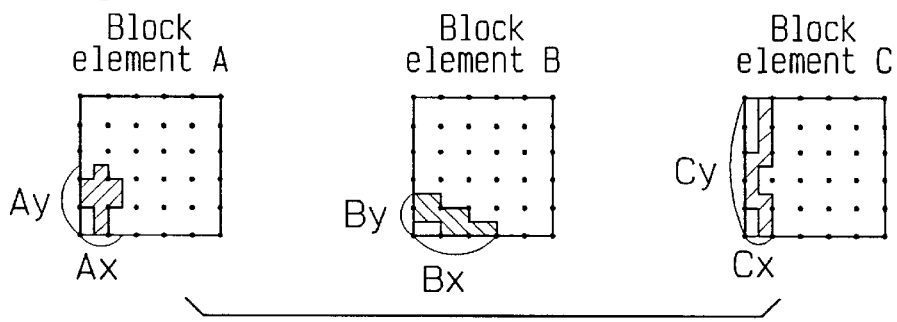

Block element A, Block element B, Block element C

Fig.15(b)

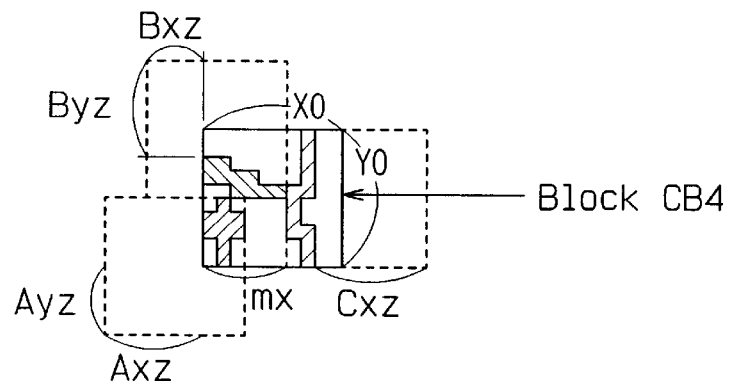

Block CB4

| Offset amounts | | |
|---|---|---|
| Block element A | $\Delta Ax = -Axz$ | Block element C $\Delta Cx = Bx (=mx)$ |
| | $\Delta Ay = -Ayz$ | $\Delta Cy = 0$ |
| Block element B | $\Delta Bx = -Bxz$ | |
| | $\Delta By = Ay$ | |

Fig.15(c)

Block pattern

| Block number=CB4 |
|---|
| Pattern data (Pattern of block element A, pattern of block element B shifted by Ay and pattern of block element C shifted by Bx) |

Block data

| Block number=CB4 | Block element A |
| Offset amount: $-Axz$ $-Ayz$ | |
| Block number=CB4 | Block element B |
| Offset amount: $-Bxz$ $Ay$ | |
| Block number=CB4 | Block element C |
| Offset amount: $Bx$ $0$ | |

Fig.17(a)

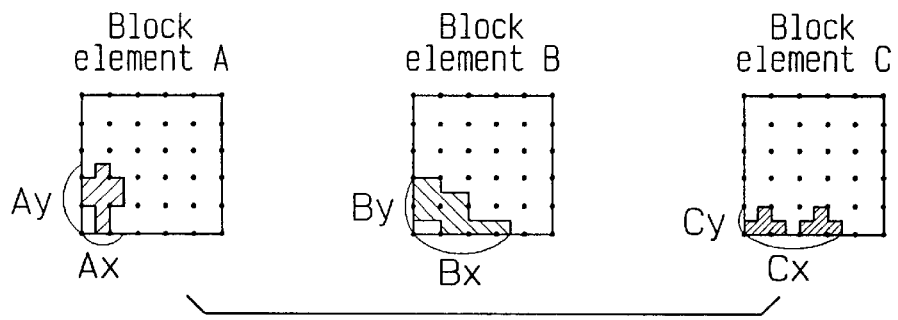

Fig.17(b)

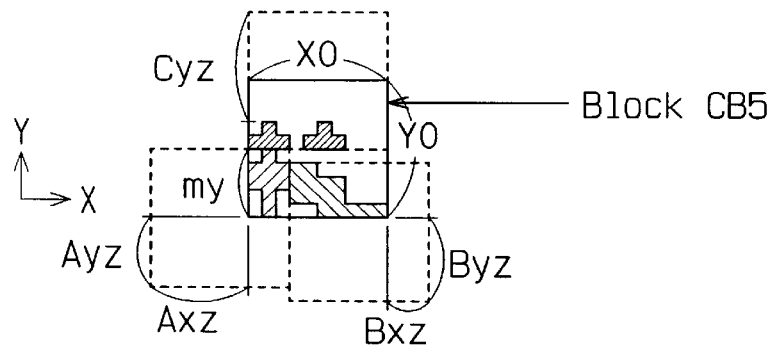

| Offset amounts | |
|---|---|
| Block element A  $\Delta Ax=-Axz$ | Block element C  $\Delta Cx=0$ |
| $\Delta Ay=-Ayz$ | $\Delta Cy=Ay\ (=my)$ |
| Block element B  $\Delta Bx=Ax$ | |
| $\Delta By=-Byz$ | |

Fig.17(c)

Block pattern

| Block number=CB5 |
|---|
| Pattern data (Pattern of block element A, pattern of block element B shifted by Ax and pattern of block element C shifted by Ay) |

Block data

| Block number=CB5 | Block element A |
|---|---|
| Offset amount: $-Axz$ $-Ayz$ | |
| Block number=CB5 | Block element B |
| Offset amount: $Ax$ $-Byz$ | |
| Block number=CB5 | Block element C |
| Offset amount: $0$ $Ay$ | |

| Offset amounts | | | |
|---|---|---|---|
| Block element A | $\Delta Ax=-Axz$<br>$\Delta Ay=-Ayz$ | Block element C | $\Delta Cx=-Cxz$<br>$\Delta Cy=Ay$ |
| Block element B | $\Delta Bx=Ax$<br>$\Delta By=-Byz$ | | |

Fig.25(a)

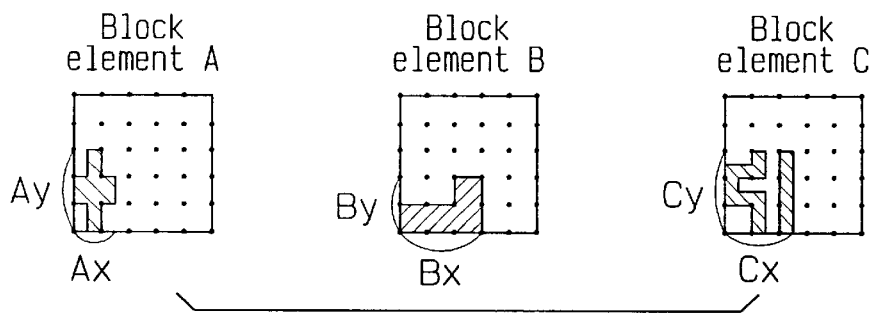

Fig.25(b)

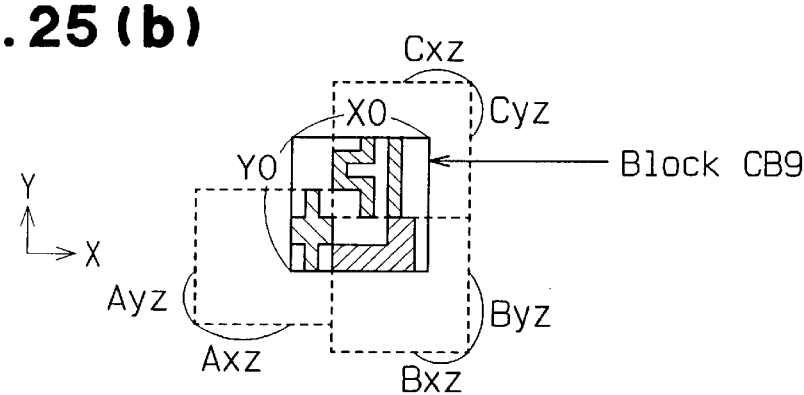

| Offset amounts |
|---|
| Block element A  ΔAx=-Axz   Block element C  ΔCx=Ax |
|                  ΔAy=-Ayz                    ΔCy=By |
| Block element B  ΔBx=Ax |
|                  ΔBy=-Byz |

Fig.25(c)

Block pattern

| Block number=CB9 |
|---|
| Pattern data (Pattern of block element A, pattern of block element B shifted by Ax and pattern of block element C shifted by Ax and By) |

Block data

| Block number=CB9 | Block element A |
|---|---|
| Offset amount: -Axz, -Ayz | |
| Block number=CB9 | Block element B |
| Offset amount: Ax, -Byz | |
| Block number=CB9 | Block element C |
| Offset amount: Ax, By | |

Fig.28(a)
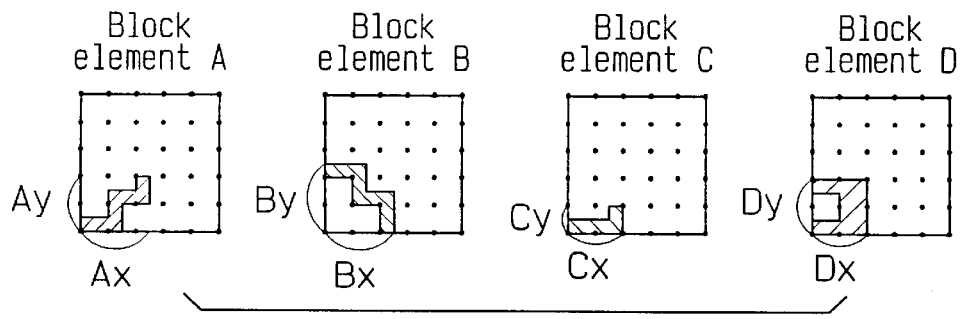
Fig.28(b)
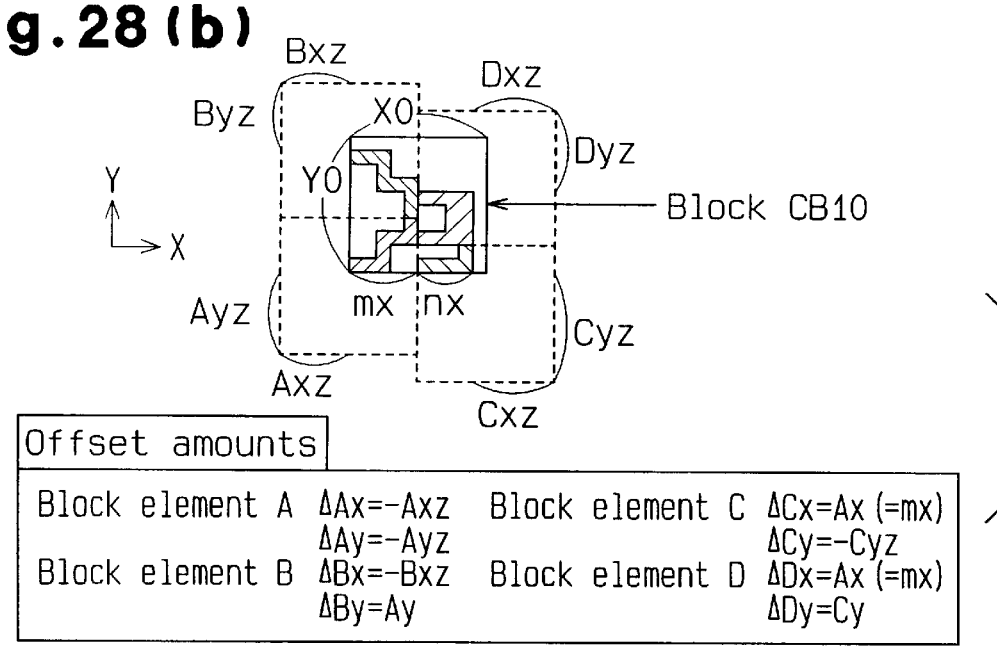
Fig.28(c)

BLOCK EXPOSURE OF SEMICONDUCTOR WAFER

BACKGROUND OF THE INVENTION

1. Field of the Invention

The present invention relates to an exposure method for semiconductor wafers and, more particularly, to block exposure.

2. Description of the Related Art

Because current LSI technology is seeking to develop larger scale integration and further miniaturized structures, it needs techniques for improving the speed and precision of exposing an LSI pattern on a semiconductor wafer. Block exposure is one of such exposure techniques.

FIG. 1 shows a conventional variable rectangular exposure unit 10. In this unit 10, a beam from a beam source 11 is irradiated on a first plate 12 and the beam, after passing a rectangular window 13 of the first plate 12, is deflected by an electromagnetic deflector 14. The cross-sectional shape of the beam which passes a rectangular window 16 formed on a second plate 15, i.e. the exposure pattern, depends on how the deflected beam is placed over the rectangular window 16. After passing the second plate the beam is further deflected by another electromagnetic deflector 17 to expose a predetermined area on a semiconductor wafer 18. This variable rectangular exposure technique cannot expose more than one pattern with a single shot of the beam.

FIG. 2 shows a conventional block exposure unit 20. In place of the second plate 15 shown in FIG. 1, this unit 20 uses a block mask 21 which has a plurality of blocks 22 each having a pattern. This block exposure can expose a plurality of patterns with a single shot of a beam. Because the patterns set on the block mask 21 affect the exposure speed and the exposure precision, it is desirable for the block mask 21 to have as many patterns as possible.

FIG. 3 is a flowchart illustrating procedures for generating data for block exposure. The block mask 21 of FIG. 2 is produced in accordance with this flowchart. In step 30 in FIG. 3, basic data (mask pattern data) from a basic data file 41 is input to a control unit (not shown) of the exposure unit 20 of FIG. 2, and various pattern processes are executed in step 31. Data collected after pattern processing is set as intermediate data in an intermediate data file 42.

Intermediate data from the intermediate data file 42 is input in step 32, and in step 33 a process of extracting a block element from the intermediate data is performed based on control statements 43. The extracted block pattern data is stored in a block pattern data file 46. For example, when the intermediate data is the pattern of memory cells 50 as shown in FIG. 4, block elements 51, 52 and 53 are extracted from the file 46 to avoid repetition.

When the intermediate data is an end portion of a cell array or a horizontally or vertically long pattern 55, as shown in FIG. 5, block elements 56, 57 and 58 are extracted from the file 46 to avoid repetition.

In step 34 of FIG. 3, the block pattern data extracted from the file 46 is received and is sent as block element data to a block data file 44. In step 35, it is determined whether the number of block elements output to the block data file 44 is equal to or greater than the number of block elements that can be installed on the block mask. The processes in steps 33–35 are repeated until the number of block elements equals or exceeds the number that can be installed.

In step 36, block pattern data is divided or segmented into rectangular shapes for exposure of the block mask based on the block data read from the block data file 44. The segmented data are output to a segment data file 45. In step 37, the segmented block data is read from the segment data file 45 and converted to exposure data which is in turn output to an exposure data file 47.

In step 38, pattern data that is different from the block elements extracted from the intermediate data file 42 is segmented into rectangular shapes, which are supplied to the segment data file 45. In step 39, segment data that is different from the extracted block elements is read from the segment data file 45 and converted to exposure data which is in turn sent to the exposure data file 47.

According to this conventional method, as shown in FIG. 4, block elements 51 to 53 extracted for fabricating the memory cells 50 are directly installed on the block mask (not shown). Also, as shown in FIG. 5, the block elements 56–58 extracted from the end portion of a cell array or the horizontally or vertically long pattern 55 according to the block size are set on the block mask (not shown) block by block even though patterns exist only at the end portion of a block. This may lead to lower exposure efficiency.

Further, the number of patterns to be installed as block elements is limited by the number of patterns that can be installed on the block mask. Therefore, those patterns which cannot be set on the block mask should be exposed by using the conventional exposure techniques. This results in a slower exposure speed and lower exposure precision.

Thus, a more efficient and faster exposure method resulting in higher precision is needed.

SUMMARY OF THE INVENTION

It is an object of the present invention to provide a block exposing method that permits a greater number of patterns of extracted block elements to be installed on a block mask to thereby ensure faster block exposure at higher precision.

The present invention provides a method, an apparatus and a recording medium for block exposure on a semiconductor wafer using a block mask that has an exposure pattern separated into blocks. Each block comprises a plurality of block elements having parts of the exposure pattern and installed on the block mask. A plurality of block elements having predetermined patterns are extracted from the exposure pattern. Each of the predetermined patterns is present in at least one partial area of an associated block element. A combination of multiple extracted block elements, having patterns arrangeable in a single block, is specified based on areas of the individual extracted block elements where patterns are present. The combined patterns of extracted block elements are laid out in a single block and an irradiation mode of that block is changed from a full irradiation mode to a partial irradiation mode.

Because the patterns of a plurality of extracted block elements can be laid out in a single block, the number of extracted block elements that can be installed on the block mask is increased. This permits faster block exposure at higher precision.

These and other features and advantages of the present invention will become apparent upon reading the following detailed description and studying the various figures of the drawings.

BRIEF DESCRIPTION OF THE DRAWINGS

The present invention, together with objects and advantages thereof, may best be understood by reference to the following detailed description of the presently preferred embodiments together with the accompanying drawings, wherein like reference numerals designate like structural elements, and in which:

FIG. 6(a) is a block diagram illustrating an exposure unit which operates according to the invention;

FIG. 6(b) is a flowchart illustrating procedures of generating data for the block exposure according to the invention;

FIGS. 7(a) through 7(d) are explanatory diagrams showing the differences between full irradiation type exposure and partial irradiation type exposure;

FIGS. 15(a) through 15(c) are explanatory diagrams for the first combination of three extracted block elements associated with the flowchart of FIG. 14;

FIGS. 17(a) through 17(c) are explanatory diagrams for the second combination of three extracted block elements associated with the flowchart of FIG. 16;

FIGS. 25(a) through 25(c) are additional explanatory diagrams for the fourth combination of three extracted block elements associated with the flowcharts of FIGS. 22 and 23;

FIGS. 28(a) through 28(c) are explanatory diagrams for the first combination of four extracted block elements associated with the flowcharts of FIGS. 26 and 27;

DETAILED DESCRIPTION OF THE PREFERRED EMBODIMENTS

Figure 1:
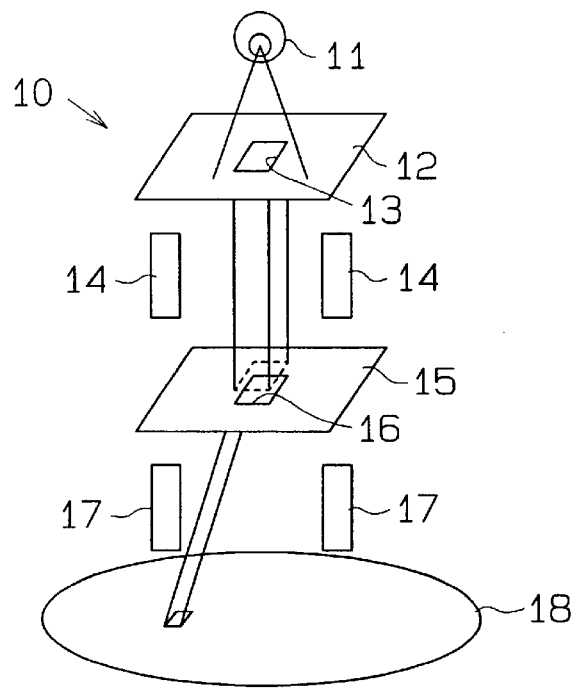
FIG. 1 is a schematic diagram of an apparatus for use in a conventional variable rectangular exposure technique.
Figure 2:
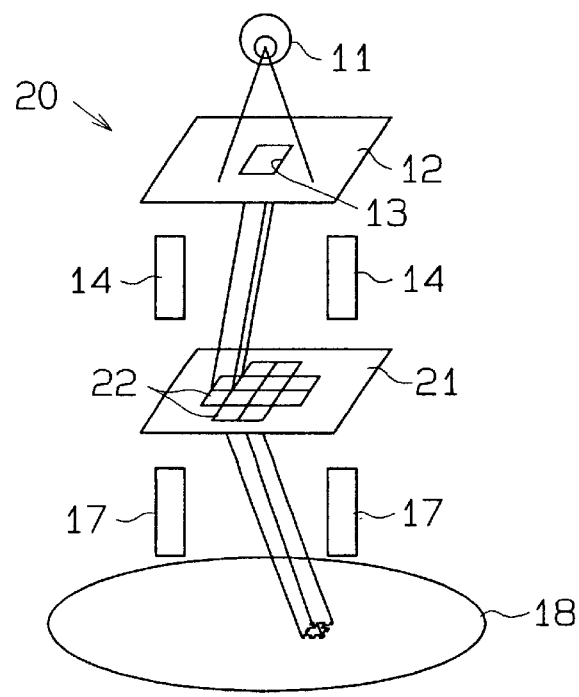
FIG. 2 is a schematic diagram of an apparatus for use in a conventional block exposure technique.
Figure 3:
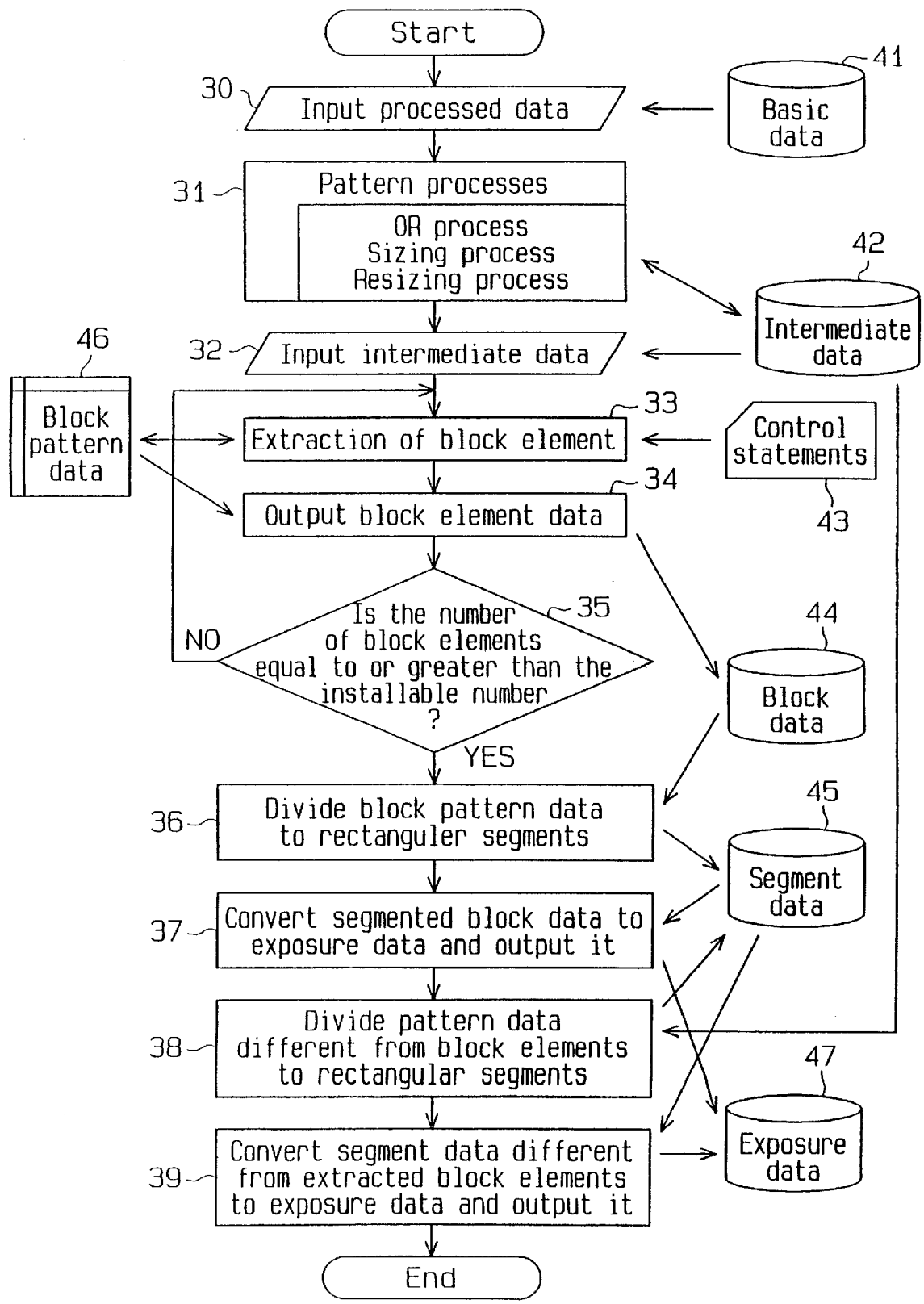
FIG. 3 is a flowchart illustrating procedures of generating data for the conventional block exposure associated with the apparatus of FIG. 2.
Figure 4:
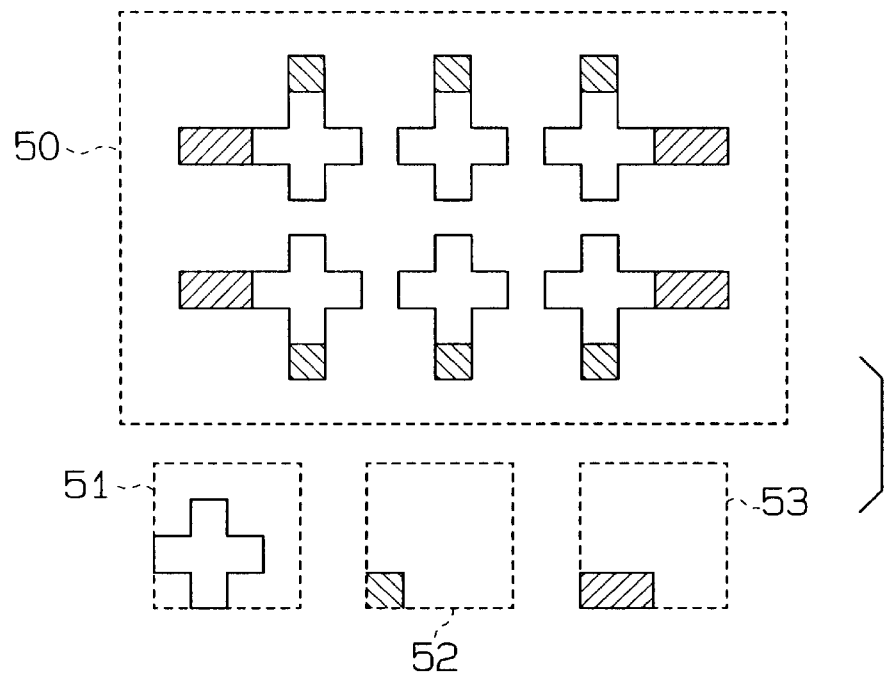
FIG. 4 is an explanatory diagram showing conventional extracted block elements.
Figure 5:
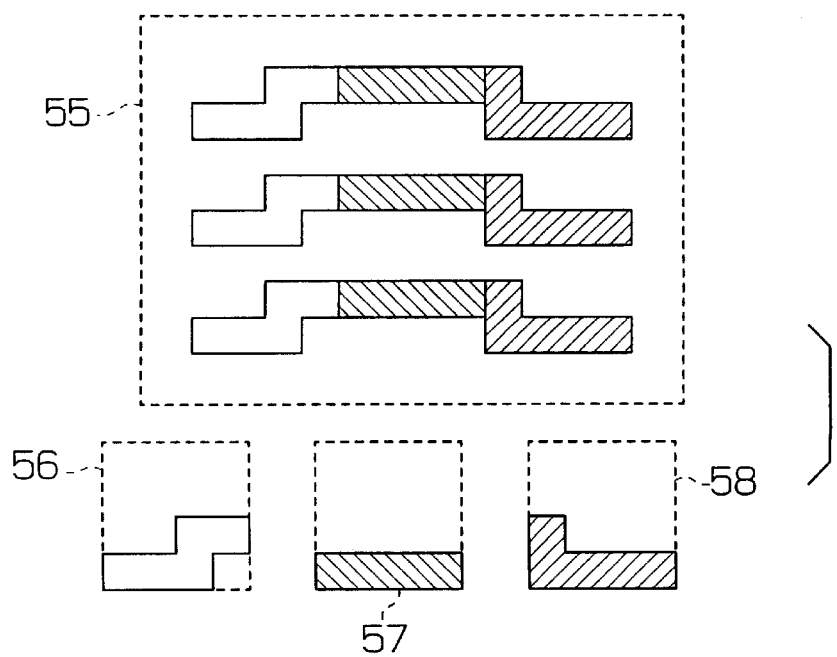
FIG. 5 is an explanatory diagram showing other conventional extracted block elements.

A preferred embodiment of the present invention will now be described with reference to FIGS. 6 through 31. For the sake of descriptive simplicity and to avoid redundancy, throughout the following description like or same reference numerals are given to those components which are the same as the corresponding components of the structures shown in FIGS. 2 and 3.

FIG. 6(a) illustrates a block exposure unit 20 which is used to generate data for the exposure of a block mask according to an embodiment of the present invention. FIG. 6(b) presents a flowchart illustrating a program used to control the block exposure unit 20. The block exposure unit 20 is associated with a control unit 20a and a memory device 20b. The aforementioned program is stored on a recording medium such as a program memory 70 in the memory device 20b.

The memory device 20b has a basic data file 41, an intermediate data file 42, a block data file 44, a segment data file 45 and an exposure data file (block pattern data file) 46 shown in FIG. 6(b).

In step 30 in the flowchart of FIG. 6(b), basic data (mask pattern data) is input from the basic data file 41 to the control unit 20a of the block exposure unit 20 and various pattern processes are performed in step 31. After pattern processing data is stored as intermediate data in the intermediate data file 42.

In step 32, intermediate data is input to the block exposure unit 20 from the intermediate data file 42. In step 33, patterns (e.g., P1 to P4 shown in FIG. 9(a)) which are repeatedly used are extracted as block elements (e.g., A and B in FIG. 9(a)) from the intermediate data according to control statements 43 stored in the program memory 70 shown in FIG. 6(a), and the extracted block pattern data is stored in the block pattern data file 46. The process in step 33 is repeated until all of the pieces of intermediate data are extracted from the intermediate data file 42 based on the determination result in step 60.

In step 61, a plurality of extracted block elements having patterns which can be fit in a single block are combined on the basis of the areas in the individual extracted block elements A–D where the patterns P1–P4 are present. At this time, the irradiation mode of block data is changed from a full irradiation mode to a partial irradiation mode.

FIGS. 7(a) through 7(d) show the differences between full irradiation type exposure and partial irradiation type exposure. In the full irradiation type as shown in FIG. 107(a), a beam irradiation range 23 corresponds to a single block 22 on a block mask 21, whereas in the partial irradiation type as shown in FIG. 7(b), the beam irradiation range 23 is shifted with respect to the single block 22 on the block mask 21. In the latter case, the beam irradiation range 23 is offset Δx and Δy in the X direction and the Y direction relative to the block 22 as shown in FIG. 7(c). FIG. 7(d) shows the data structures in both exposure types. Data for both exposure types have a block number and block pattern data, and data for the partial irradiation type is added with the amounts of offset with respect to data for the full irradiation type.

In the next step 34 in FIG. 6(b), block pattern data is read from the block pattern data file 46 in accordance with the combination of the extracted block elements, and is sent as block data to the block data file 44. In step 36, the block data is read from the block data file 44 and block pattern data is divided into rectangular segments for the exposure of the block mask. The segmented data is output to the segment data file 45. In step 37, segmented block data is read from the segment data file 45 and is converted to exposure data which is in turn output to the exposure data file 47.

In step 38, pattern data which is different from the pattern data of the extracted block elements combined as a block, is read from the intermediate data file 42. The read pattern data is divided into rectangular segments which are then output to the segment data file 45. In step 39, segmented data different from the extracted block elements is read from the segment data file 45 and is converted to exposure data which is in turn output to the exposure data file 46.

Figure 8:
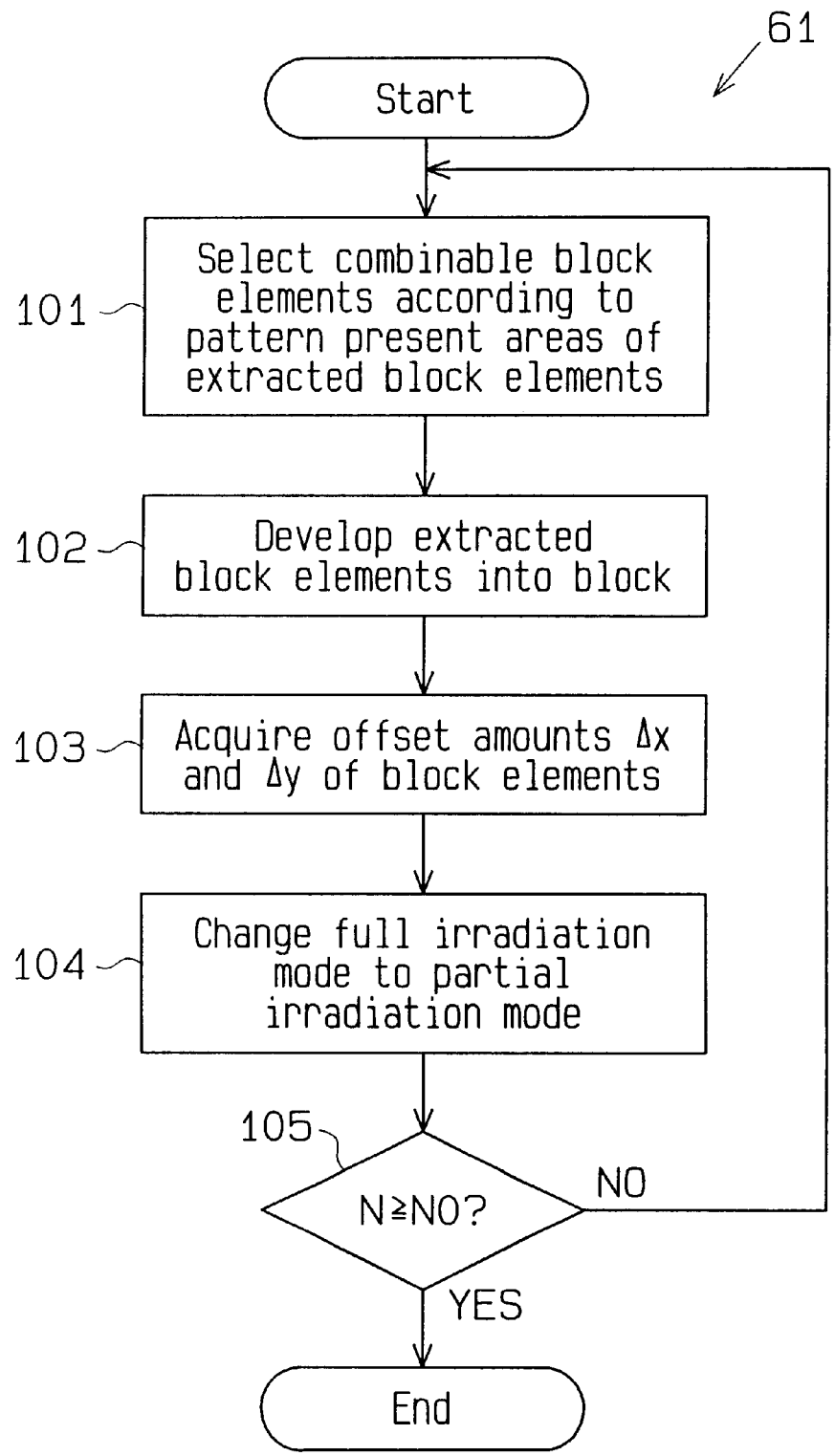
FIG. 8 is a flowchart illustrating the basic operation for combining extracted block elements.

FIG. 8 is a flowchart specifically illustrating the process 61 of combining extracted block elements in FIG. 6. In step 101, extracted block elements which can be combined are selected based on the X and Y dimensions of the area where the pattern of each extracted block element exists. In step 102, the extracted block elements to be combined are developed into a block.

In step 103, the amounts of offset for the block are obtained to support partial irradiation. As the block data are additionally set to the acquired amounts of offset in step 104, the data is changed from the full irradiation type to a partial irradiation type. Steps 101 to 104 are repeated until the number of blocks "N" on the block mask reaches an installable block number "NO" as indicated in step 105.

Figure 9A:
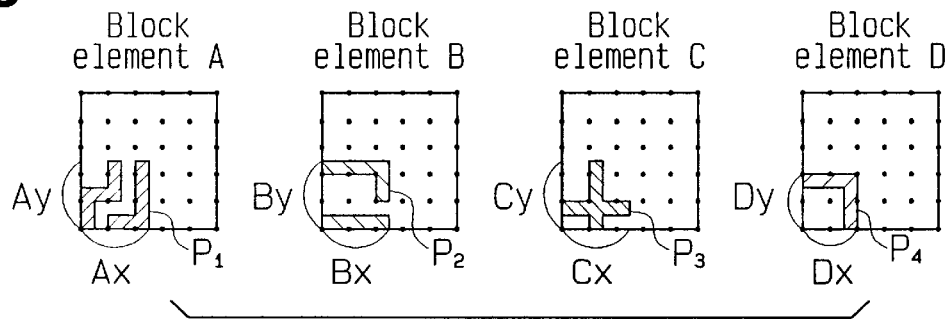
FIGS. 9(a) through 9(c) are explanatory diagrams for the basic combinations of extracted block elements which are generated according to the flowchart in FIG. 8.
Figure 9B:
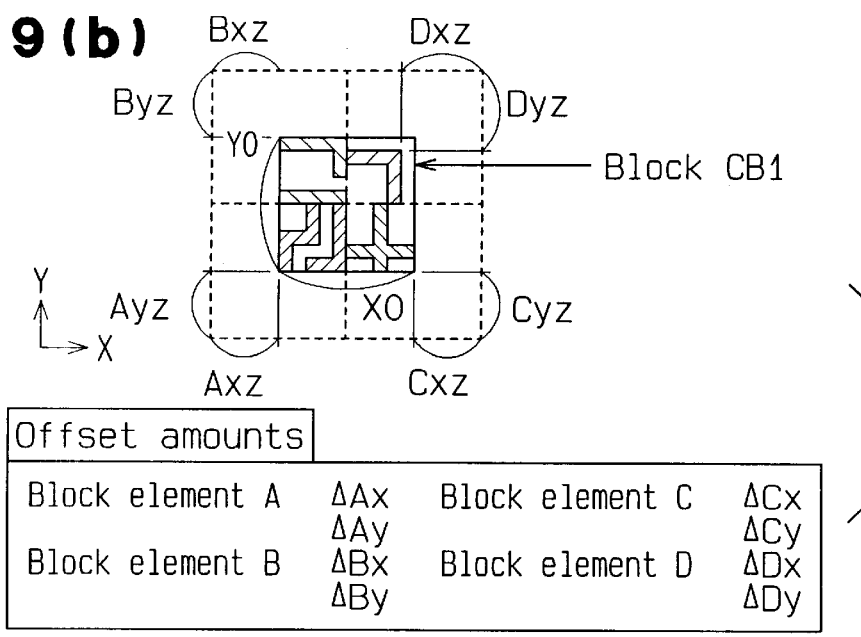
Figure 9C:
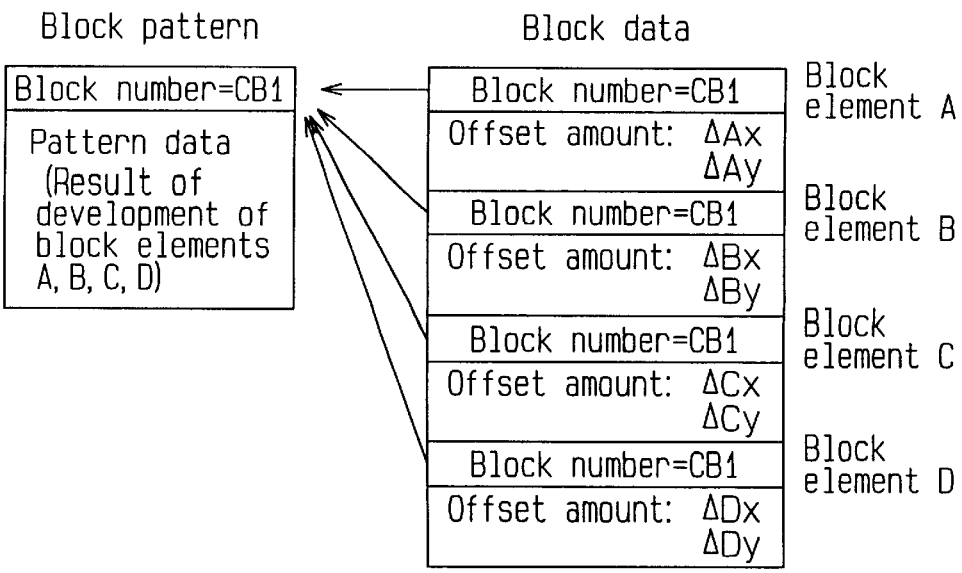

The above described processing will be further discussed referring to FIGS. 9(a) through 9(c). Note that hereinafter the x dimension and the Y dimension of an area where a pattern is present will simply be called "pattern present areas" for the sake of descriptive simplicity. Also note that the sizes of each block and each extracted block element in the X and Y directions are called "X dimension" and "Y dimension" and are expressed by X0 and Y0, respectively.

It is to be noted that values obtained by subtracting pattern present areas Ax, Bx, Cx and Dx from the X dimension X0 of a block are expressed by Axz, Bxz, Cxz and Dxz, respectively. It is to be also noted that values obtained by subtracting pattern present areas Ay, By, Cy and Dy from the Y dimension Y0 of a block are expressed by Ayz, Byz, Cyz and Dyz, respectively. Those values Axz, Bxz, Cxz, Dxz, Ayz, Byz, Cyz and Dyz are respectively equal to offset amounts ΔAx, ΔBx, ΔCx, ΔDx, ΔAy, ΔBy, ΔCy and ΔDy. That is, Axz=X0−Ax=ΔAx, Ayz=Y0−Ay=ΔAy, Bxz=X0−Bx=ΔBx, Byz=Y0−By=ΔBy, Cxz=X0−Cx=ΔCx, Cyz=Y0−Cy=Δcy, Dxz=X0−Dx=ΔDx, Dyz=Y0−Dy=ΔDy.

First, with respect to the block elements A to D extracted in step 101, their pattern present areas Ax, Ay, Bx, By, Cx, Cy, Dx and Dy are acquired, and the block elements A to D are combined as shown in FIG. 9(b) in accordance with the pattern present areas. In the diagram, four broken-lined frames indicate the ranges of a block where a beam is partially irradiated; in this example, a block CB1 is entirely exposed by four partial irradiations.

In step 102, the block patterns of the block elements A to D are developed on the block CB1 based on the pattern present areas of the individual block elements. The developed pattern is set as the block pattern of the block CB1 as shown in FIG. 9(c).

In step 103, to actually effect the partial irradiation of the block elements A to D, the offset amounts ΔAx, ΔAy, ΔBx, ΔBy, ΔCx, ΔCy, ΔDx and ΔDy are acquired from the above given equations in accordance with the developing positions of the block elements A to D to the block CB1 with the lower left corner of the block CB1 as a reference. In step 104, the acquired offset amounts are stored together with the reference block number CB1 in the file as indicated in the block data in FIG. 9(c).

First Combination of Extracted Block Elements

Figure 10:
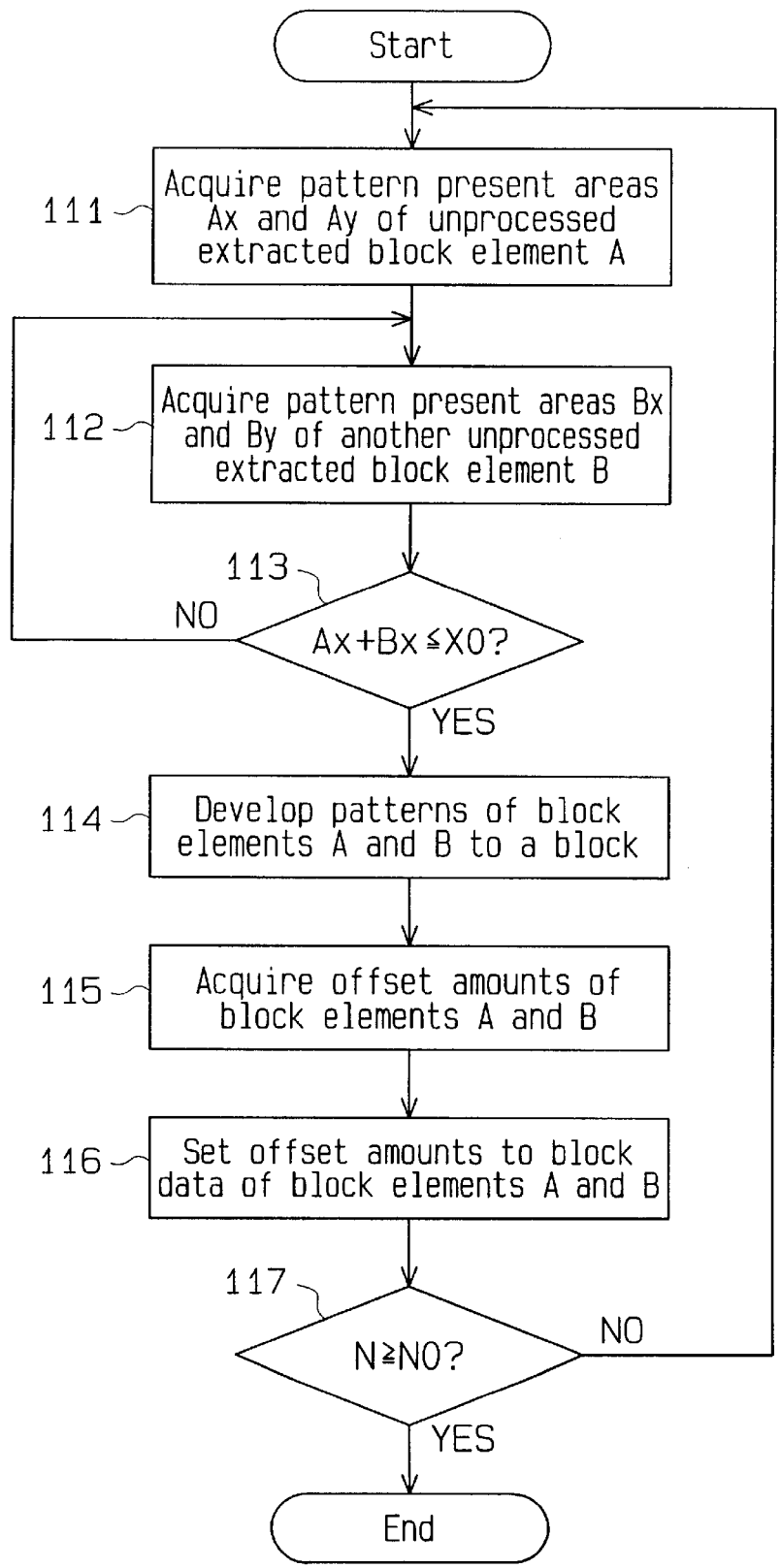
FIG. 10 is a flowchart for a first combination of two extracted block elements.
Figure 11:
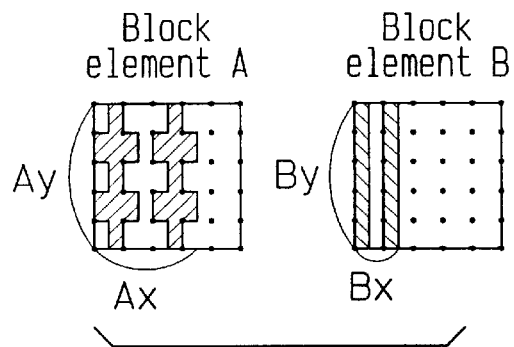
FIGS. 11(a) through 11(c) are explanatory diagrams for the first combination of two extracted block elements associated with the flowchart of FIG. 10.
Figure 11:
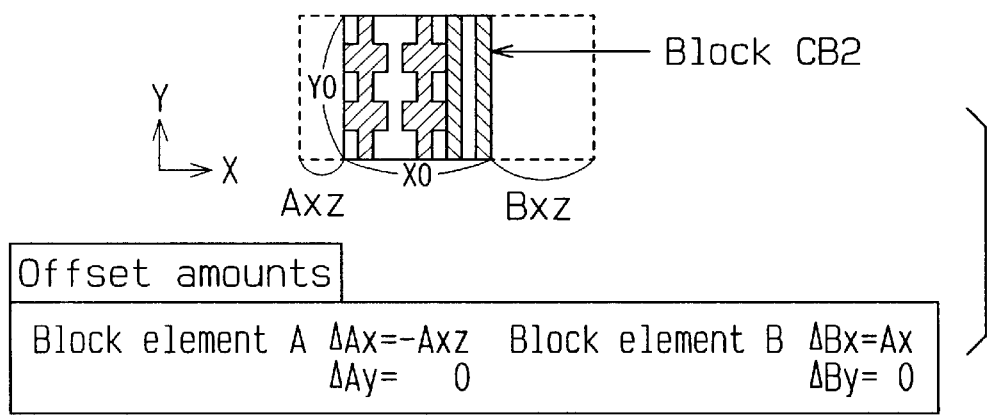
Figure 11:
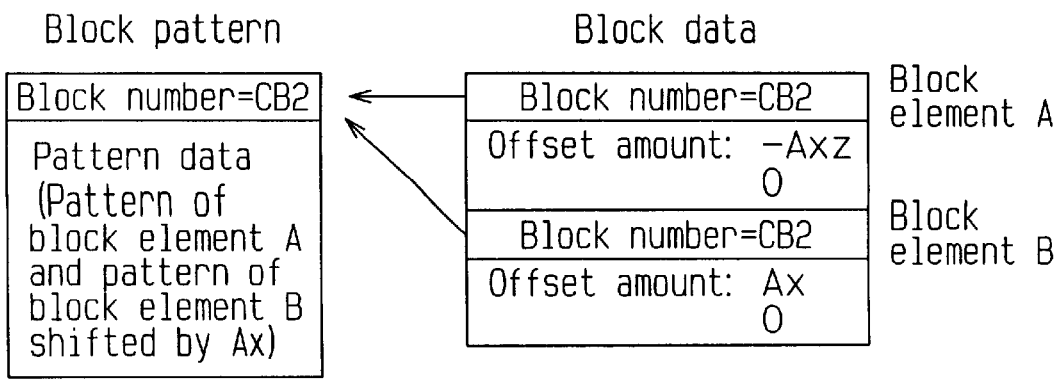

FIGS. 10 and 11 show an example in which a block is structured by combining two extracted block elements. First, a first block element A is acquired as a reference block in step 111 in FIG. 10, and its pattern present areas Ax and Ay are obtained.

In step 112, a second block element B different from the block element A is acquired and its pattern present areas Bx and By are likewise obtained. If the sum of the pattern present area Ax of the block element A and the pattern present area Bx of the block element B is less than or equal to the X dimension X0 of a block, both block elements A and B can be laid out side by side in the X direction within the formation range of the block as shown in FIG. 11(b). This determination is therefore made in step 113. Because the sum of the pattern present areas Ax and Bx is less than or equal to the X dimension X0 in this example, both block elements A and B are determined to be combinable in the X direction. Therefore, the process proceeds to the next step 114.

In step 114, the two block elements A and B which have been determined as combinable are input and their pattern development to a block is carried out. In the pattern development, as depicted in FIG. 11(b), first the pattern of the block element A is developed at the left end of the block formation range. Then, the pattern of the block element B is developed to the right of the area where the block element A has been developed. At this time, the pattern of the block element B is developed in such a manner that the lower left corner of the block element B matches with the position which has the maximum X coordinate and the minimum Y coordinate of the pattern present area of the block element A, as shown in FIG. 11(b). As a result of this combination, a pattern as shown in FIG. 11(b) is acquired.

In the subsequent step 115, with the coordinates of the lower left corner of a clock CB2 in FIG. 11(b) defined as (0, 0), the offset amounts ΔAx, ΔAy, ΔBx and ΔBy are acquired. In step 116 block data shown in FIG. 11(c), i.e., the block pattern data having the block number CB2 and data on the offset amounts affixed thereto, are stored in a file. The offset amounts acquired in step 115 indicate at which position of the block a beam should be irradiated.

In step 116, to change the full irradiation mode for the block elements A and B to the partial irradiation mode, the block number CB2 of the block is designated, the offset amounts ΔAx, ΔAy, ΔBx and ΔBy of the block elements A and B are set, and those data are then stored in the file.

In the next step 117, it is determined whether the number "N" of generated blocks has reached the installable number "N0". When the number "N" is less than the installable number "N0", steps 111 to 116 are repeated. For the formation of the exposure pattern of memory cells, for example, a plurality of blocks as discussed above are generally used to form the exposure pattern. The aforementioned steps 111 to 116 are therefore repeated in accordance with the total number of blocks to be installed.

Second Combination of Extracted Block Elements

Figure 12:
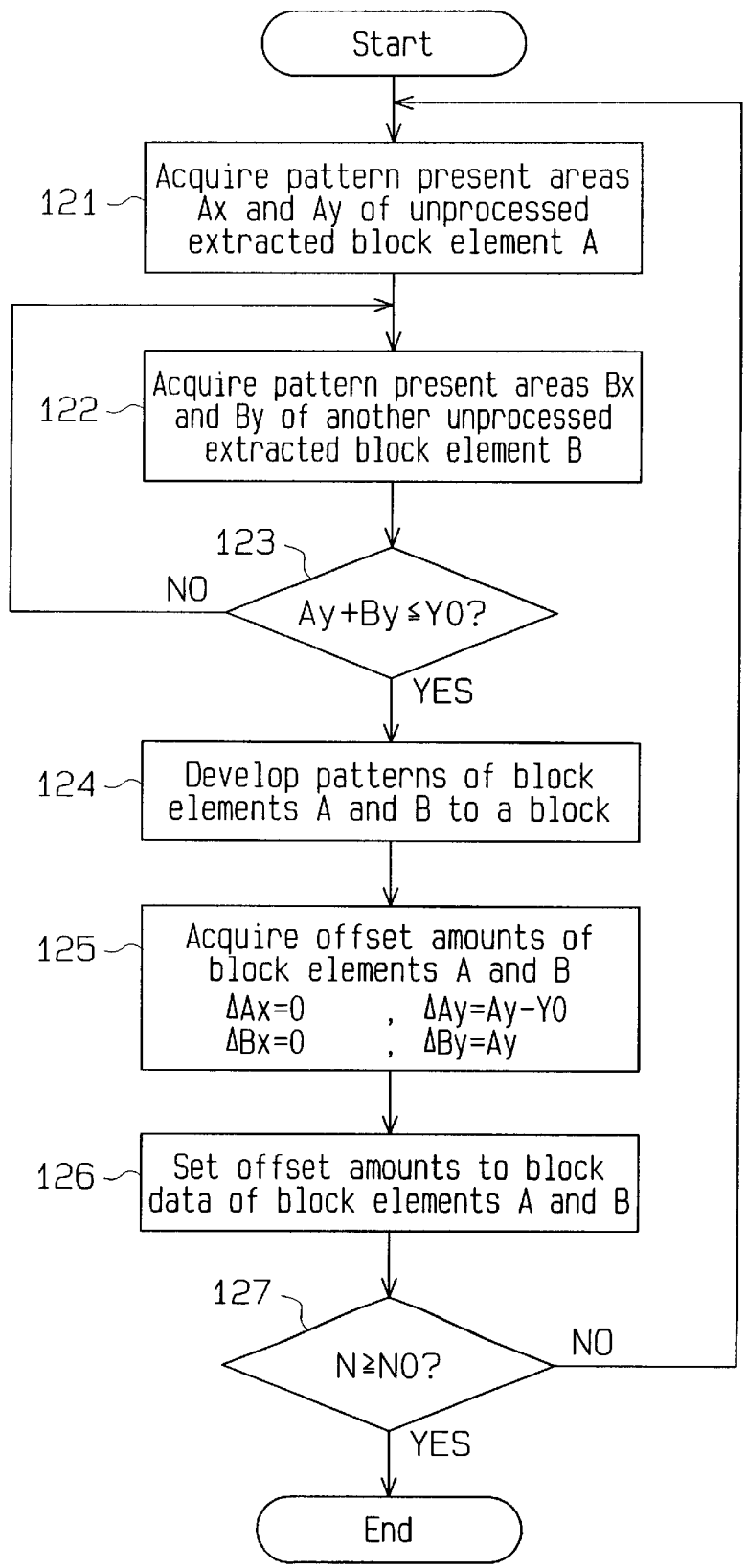
FIG. 12 is a flowchart for a second combination of two extracted block elements.

FIGS. 12 and 13 show another example in which a block is structured by combining two extracted block elements.

Figure 13A:
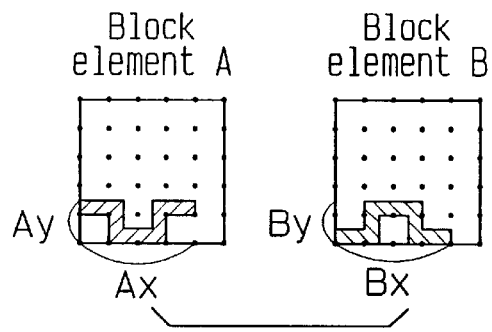
FIGS. 13(a) through 13(c) are explanatory diagrams for the second combination of two extracted block elements associated with the flowchart of FIG. 12.

First, a first block element A shown in FIG. 13(a) is acquired in step 121 in FIG. 12, and its pattern present areas Ax and Ay are obtained. In step 122, a different second block element B is acquired and its pattern present areas Bx and By are likewise obtained.

If the sum of the pattern present area Ay of the block element A and the pattern present area By of the block element B is less than or equal to the Y dimension Y0 of the block formation range, both block elements A and B can be laid out side by side in the Y direction. Therefore, determination regarding this is made in step 123. Since the sum of the pattern present areas Ay and By is less than or equal to the Y dimension Y0 in this example, as apparent from FIG. 13(b), both block elements A and B are determined to be combinable in the Y direction. Therefore, the process proceeds to the next step 124.

In step 124, the two block elements A and B which have been determined as combinable are input and their pattern development into a block is carried out. In the pattern development, first the pattern of the block element A is developed so as to be aligned with the lower left corner of a block CB3. Then the pattern of the block element B is developed above the block element A in such a manner that the lower left corner of the pattern present area of the block element B matches with the position which has the minimum X coordinate and the maximum Y coordinate of the pattern present area of the block element A. As a result of this combination, a pattern as shown in FIG. 13(b) is acquired.

Figure 13B:
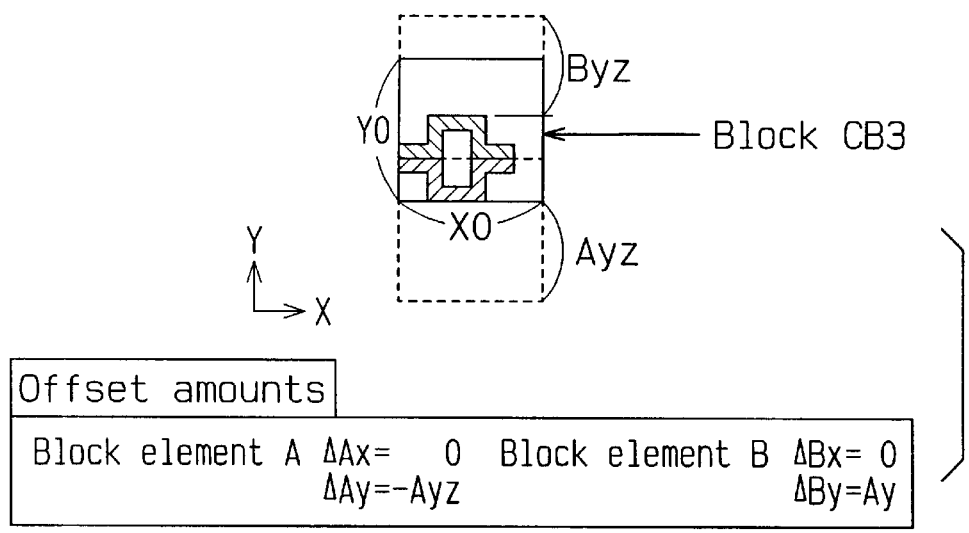
Figure 13C:
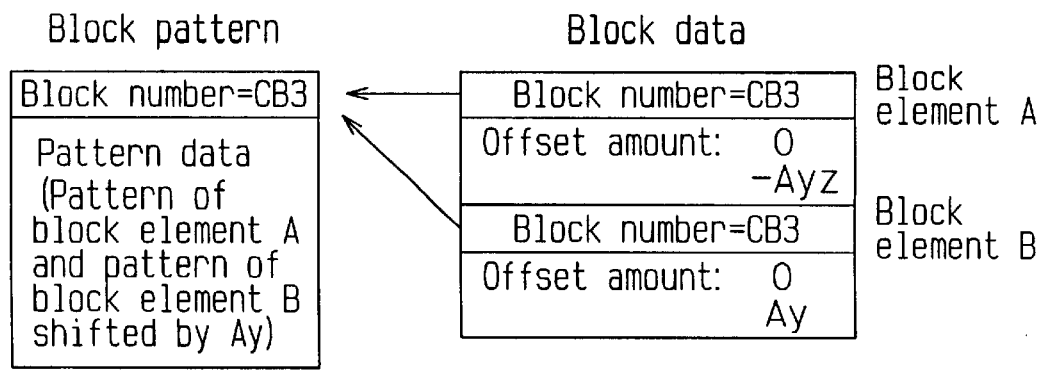

In the subsequent step 125, with the coordinates of the lower left corner of the block CB3 in FIG. 13(b) defined as (0, 0) the offset amounts ΔAx, ΔAy, ΔBx and ΔBy are acquired. In step 126, block data shown in FIG. 13(c), or the block pattern data having the block number CB3 and data on the offset amounts affixed thereto, are stored in a file.

In the next step 127, it is determined whether the number "N" of generated blocks has reached the installable number "N0". If the number "N" has not yet reached the installable number "N0", steps 121 to 126 are repeated.

Third Combination of Extracted Block Elements

Figure 14:
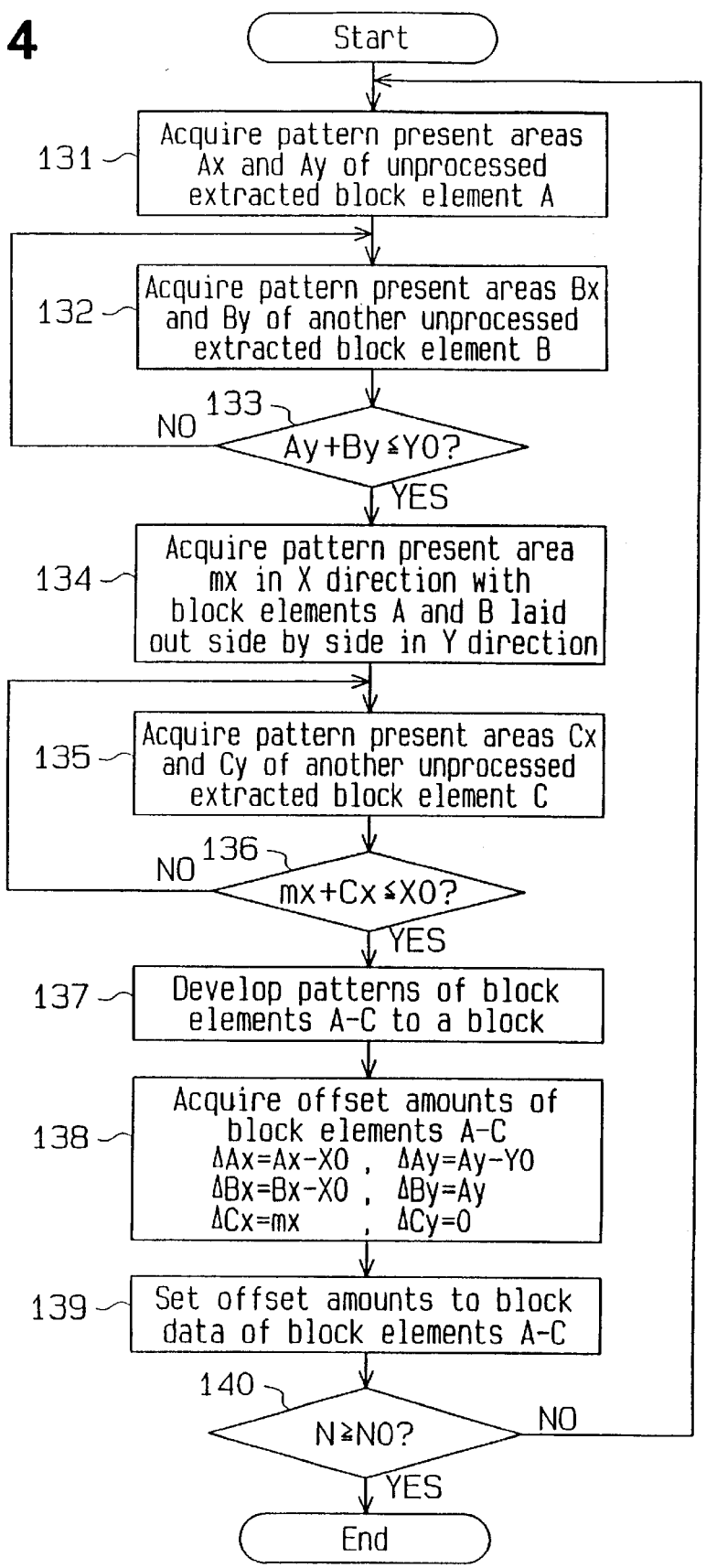
FIG. 14 is a flowchart for a first combination of three extracted block elements.

FIGS. 14 and 15 show an example in which a block is structured by combining three extracted block elements. First, a first block element A is acquired in step 131, and its pattern present areas Ax and Ay are obtained. In step 132, a second block element B is acquired and its pattern present areas Bx and By are likewise obtained. It is determined in step 133 whether the sum of the pattern present areas Ay and By is less than or equal to the Y dimension Y0 of a block. Because the sum is determined to be equal to or smaller in this example, as apparent from FIGS. 15(a) and 15(b), both block elements A and B are determined to be combinable in the Y direction and the process proceeds to the next step 134.

In step 134, the pattern present area in the X direction, "mx", of the block elements A and B laid out side by side in the Y direction, as shown in FIG. 15(b), is obtained. This pattern present area "mx" coincides with the pattern present area of the block element B in this example. In the next step 135, a third block element C is acquired and its pattern present areas Cx and Cy are obtained. It is determined in step 136 whether the sum of the pattern present areas "mx" and Cx, obtained in the previous steps 134 and 135, is less than or equal to the X dimension X0 of a block. Because the sum is less than or equal to the X dimension X0 in this example, as apparent from FIG. 15(b), the individual block elements A, B and C are determined to be combinable, and the process proceeds to the next step 137.

In step 137, the pattern of the block element A is developed so as to be aligned with the lower left corner of a block CB4. Then, the pattern of the block element B is developed on the block CB4 in such a manner that the lower left corner of the block element B matches with the position which has the minimum X coordinate and the maximum Y coordinate of the pattern present area of the block element A. Further, the pattern of the block element C is developed on the block CB4 in such a manner that the lower left corner of the pattern of the block element C matches with the position which has the maximum X coordinate of the block element A plus block element B and the minimum Y coordinate of the pattern present area of the block element A. As a result of this combination, a pattern as shown in FIG. 15(b) is attained.

In the subsequent step 138, with the coordinates of the lower left corner of the block CB4 defined as (0, 0), the offset amounts ΔAx, ΔAy, ΔBx, ΔBy, ΔCx and ΔCy are acquired. In step 139, block data shown in FIG. 15(c), or the block pattern data having the block number CB4 and data on the offset amounts affixed thereto, are stored in a file.

In step 140, it is determined whether the number "N" of generated blocks has reached the installable number "N0". If the number "N" has not yet reached the installable number "N0", steps 131 to 139 are repeated.

Fourth Combination of Extracted Block Elements

Figure 16:
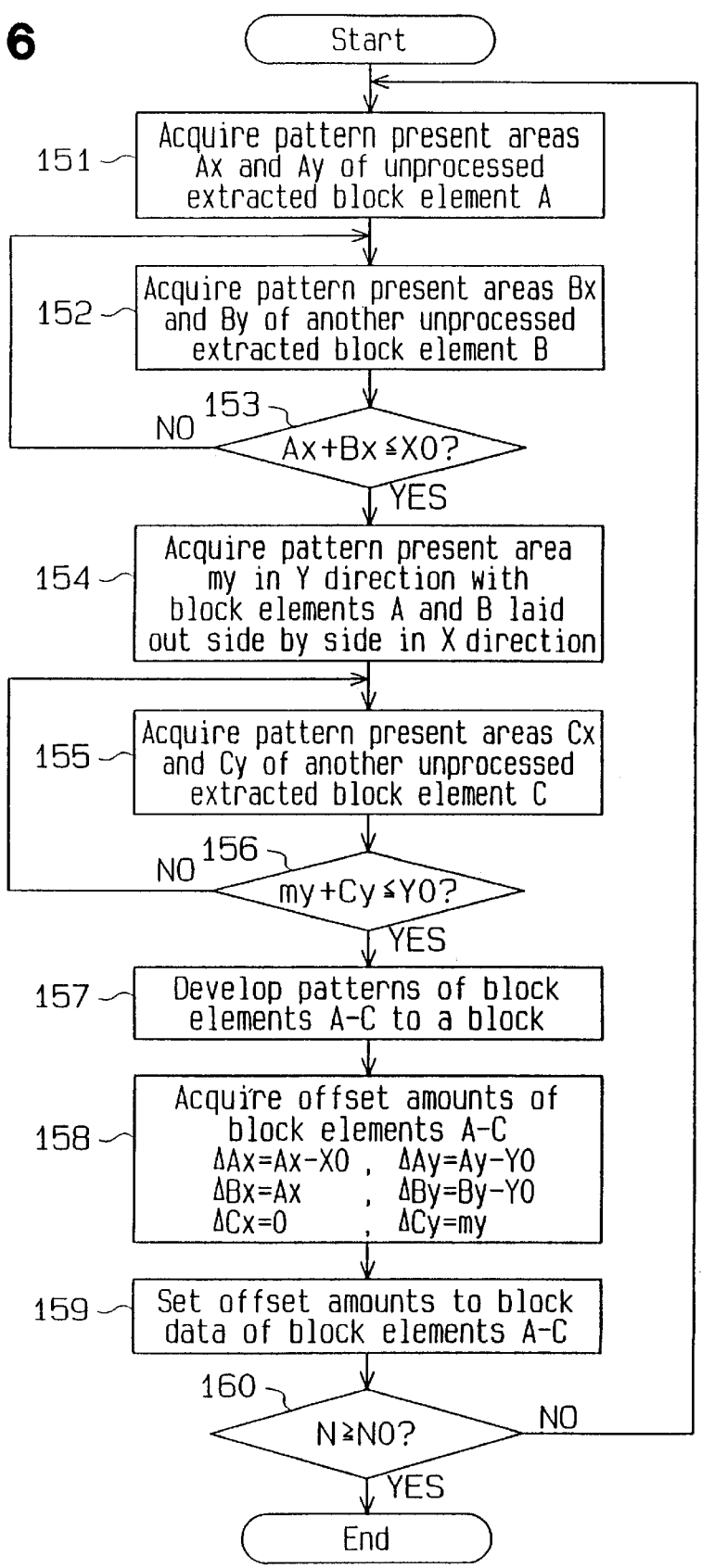
FIG. 16 is a flowchart for a second combination of three extracted block elements.
Figure 18:
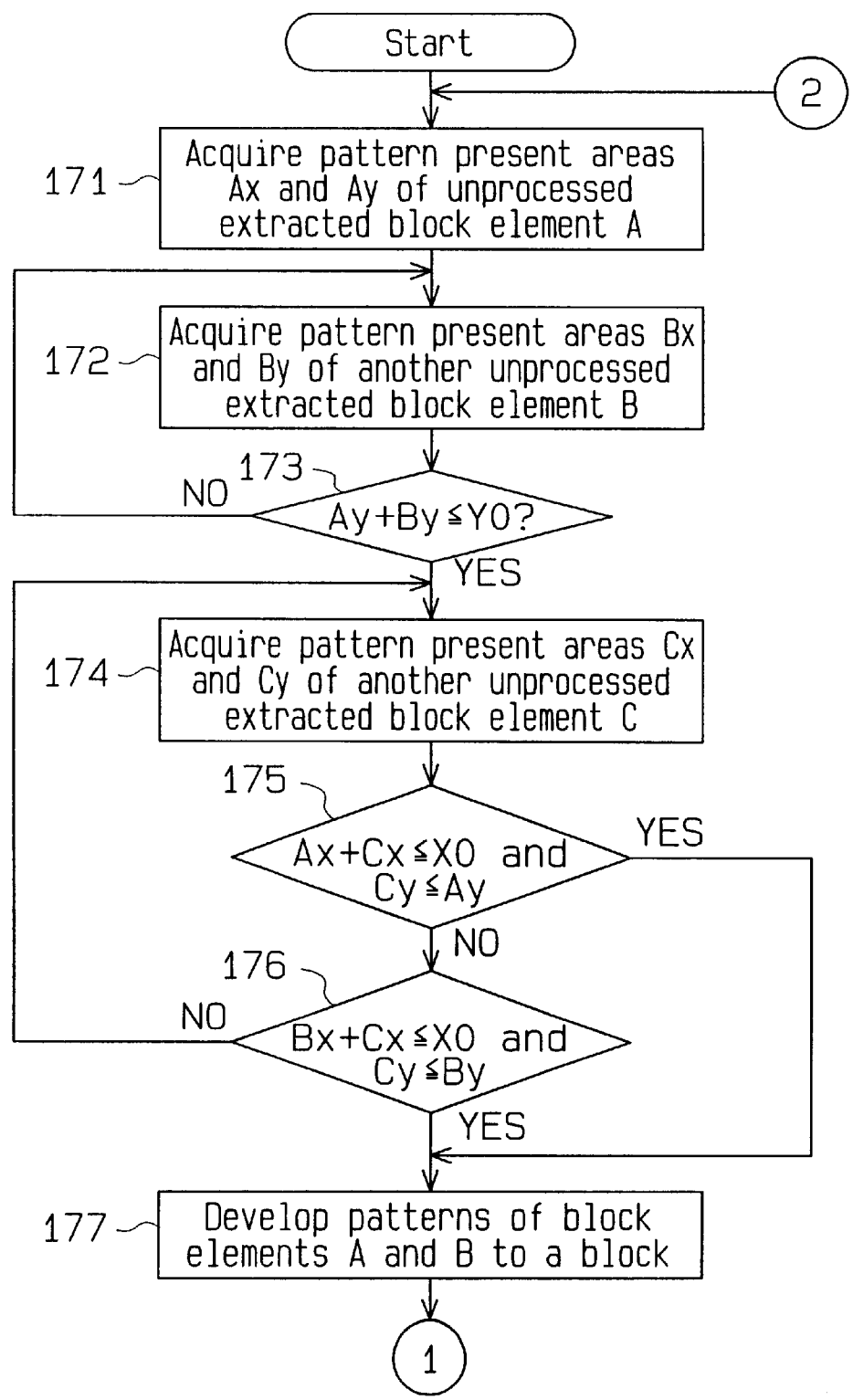
FIGS. 18 and 19 are flowcharts for a third combination of three extracted block elements.

FIGS. 16 and 17 show another example in which a block is structured by combining three extracted block elements. First, a first block element A is acquired in step 151, and its pattern present areas Ax and Ay are obtained.

In step 152, a second block element B is acquired and its pattern present areas Bx and By are likewise obtained. It is determined in step 153 whether the sum of the pattern present areas Ax and Bx is less than or equal to the X dimension X0 of a block. Because the sum is less than or equal to the X dimension X0 in this example as apparent from FIGS. 17(a) and 17(b), both block elements A and B are determined to be combinable in the X direction and the process proceeds to the next step 154.

In step 154, the pattern present area in the Y direction, "my", of the block elements A and B laid out side by side in the X direction as shown in FIG. 17(b), is obtained. This pattern present area "my" coincides with the pattern present area of the block element A in this example. In the next step 155, a third block element C is acquired and its pattern present areas Cx and Cy are obtained. It is determined in step 156 whether the sum of the pattern present areas "my" and Cy, obtained in the previous steps 154 and 155, is less than or equal to the Y dimension Y0 of a block. Because the sum is less than or equal to the Y dimension Y0 in this example, as apparent from FIGS. 17(a) and 17(b), the individual block elements A, B and C are determined to be combinable, and the process proceeds to the next step 157.

In step 157, the pattern of the block element A is developed so as to be aligned with the lower left corner of a block CB5. Then, the pattern of the block element B is developed to the right of the pattern of the block element A in such a manner that the lower left corner of the block element B matches with the position which has the maximum X coordinate and the minimum Y coordinate of the pattern present area of the block element A. Further, the pattern of the block element C is developed above the block elements A and B in such a manner that the lower left corner of the pattern of the block element C matches with the position which has the minimum X coordinate of the block element A and the maximum Y coordinate of the pattern present area of the block element A plus block element B. As a result of this combination, the pattern of the block CB5 as shown in FIG. 17(b) is acquired.

In the subsequent step 158, with the coordinates of the lower left corner of the block CB5 in FIG. 17(b) defined as (0, 0), the offset amounts $\Delta Ax$, $\Delta Ay$, $\Delta Bx$, $\Delta By$, $\Delta Cx$ and $\Delta Cy$ are acquired. In step 159, block data shown in FIG. 17(c), or the block pattern data having the block number CB5 and data on the offset amounts affixed thereto, are stored in a file.

In step 160, it is determined whether the number "N" of generated blocks has reached the installable number "N0". If the number "N" has not yet reached the installable number "N0", steps 151 to 159 are repeated.

Fifth Combination of Extracted Block Elements

FIGS. 18, 19, 20 and 21 show a further example in which a block is structured by combining three extracted block elements which are different from the block elements in the above combination. First, a first block element A is acquired in step 171 in FIG. 18, and its pattern present areas Ax and Ay are obtained. In step 172, a second block element B is acquired and its pattern present areas Bx and By are likewise obtained.

It is determined in step 173 whether the sum of the pattern present areas Ay and By is less than or equal to the Y dimension Y0 of a block. Because that sum is less than or equal to the Y dimension Y0 in the example in FIG. 20(a), both block elements A and B are determined to be combinable in the Y direction and the process proceeds to the next step 174.

In step 174, a third block element C is acquired and its pattern present areas Cx and Cy are obtained. It is determined in step 175 whether the sum of the pattern present areas Ax and Cx is less than or equal to the X dimension X0 of a block and whether the pattern present area Cy is less than or equal to the pattern present area Ay. Because both conditions are met in this example, the block elements A and C are determined to be combinable in the X direction, and the process proceeds to step 177.

In this step 177, the pattern of the block element A is developed so as to be aligned with the lower left corner of a block CB6. Then the pattern of the block element B is developed in such a manner that the lower left corner of the block element B matches with the position which has the minimum X coordinate and the maximum Y coordinate of the pattern present area of the block element A.

Figure 19:
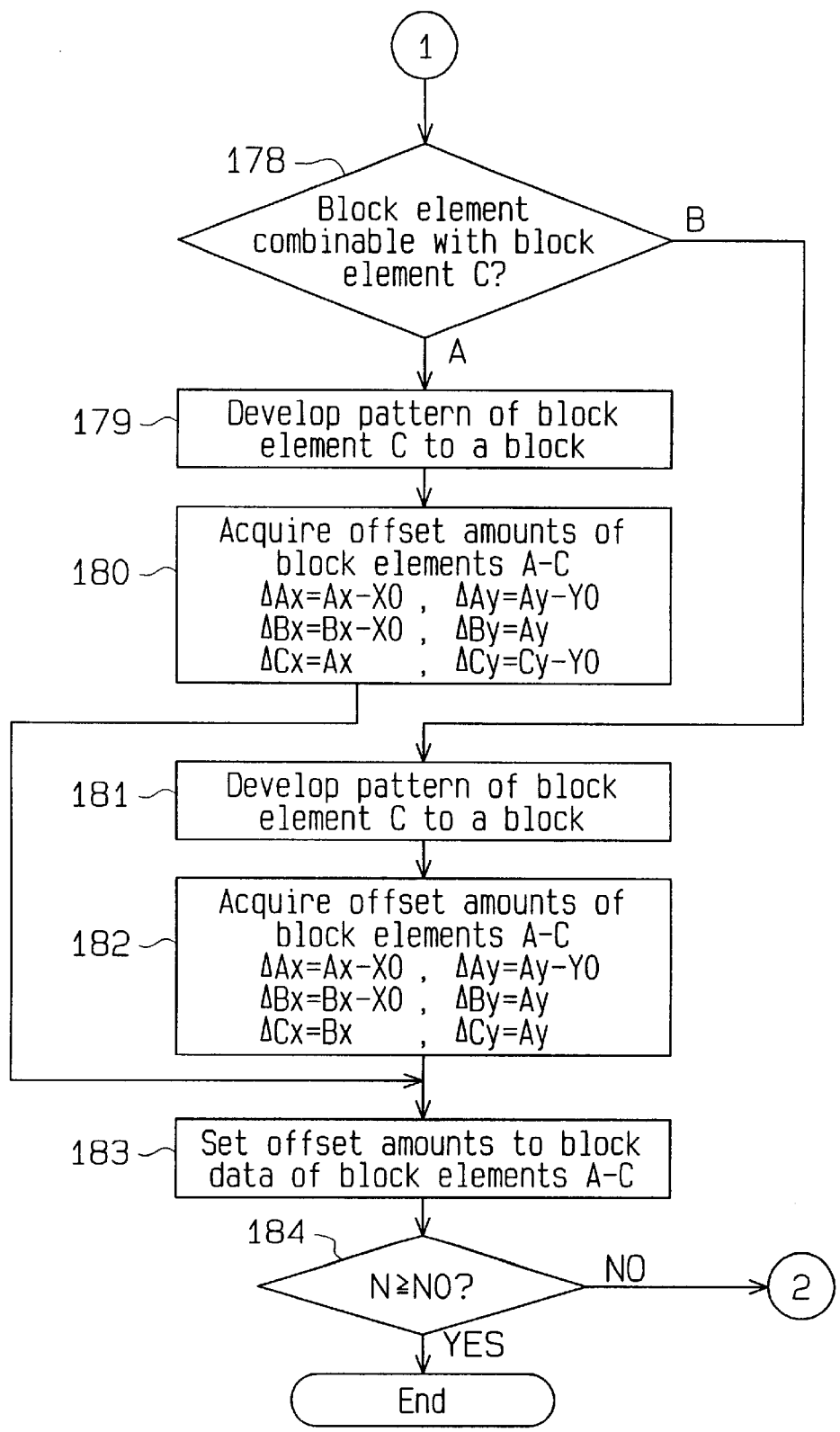

In the next step 178 shown in FIG. 19, it is determined which block element can be combined with the block element C. Because the block element A has been determined to be combinable with the block element C in the preceding step 175, the process continues with the next step 179. In step 179, the pattern of the block element C is developed in such a manner that the lower left corner of the pattern of the block element C matches with the position which has the maximum X coordinate and the minimum Y coordinate of the pattern present area of the block element A. As a result of this combination, the pattern of the block CB6 shown in FIG. 20(b) is acquired.

Figure 20A:
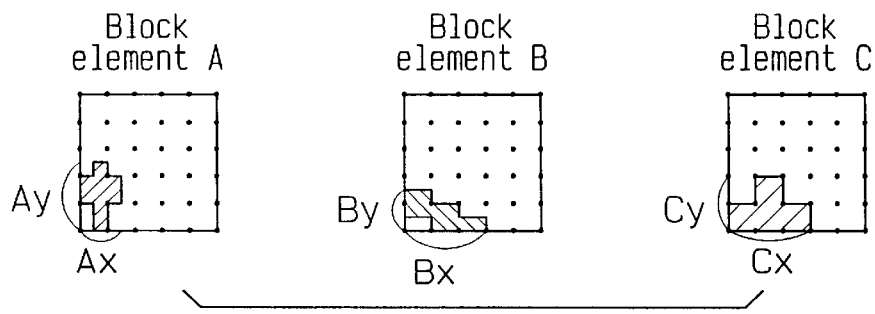
FIGS. 20(a) through 20(c) are explanatory diagrams for the third combination of three extracted block elements associated with the flowcharts of FIGS. 18 and 19.
Figure 20B:
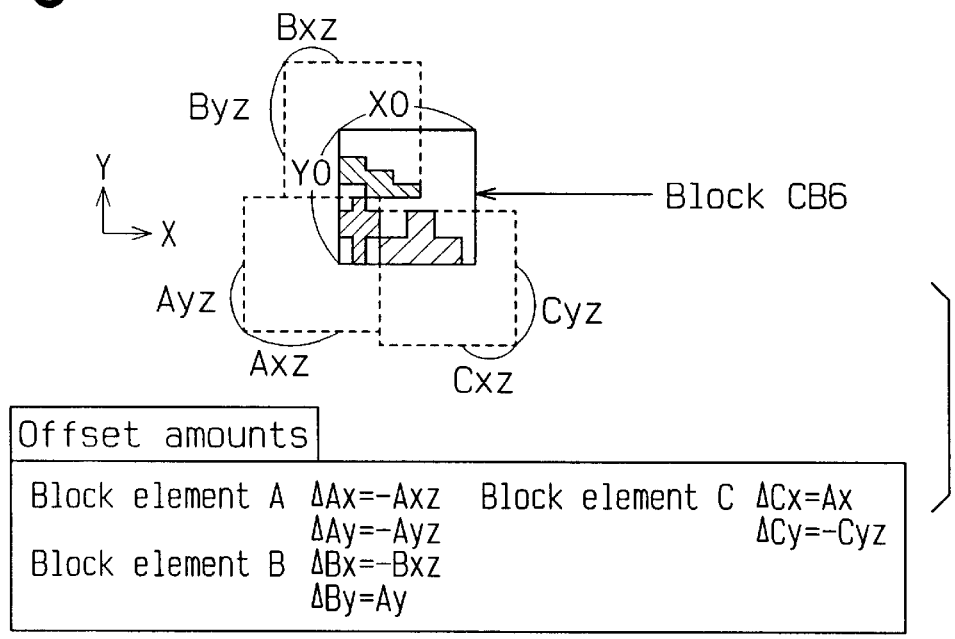
Figure 20C:
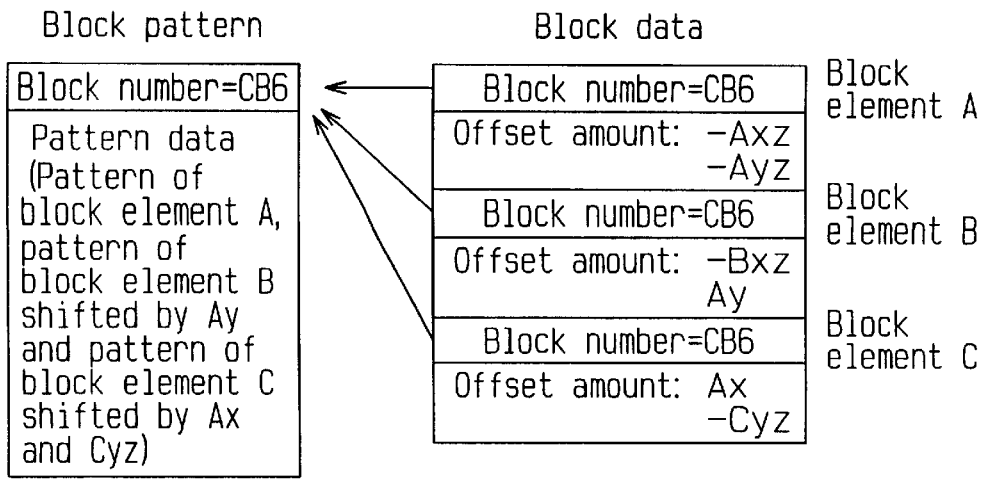
Figure 21:
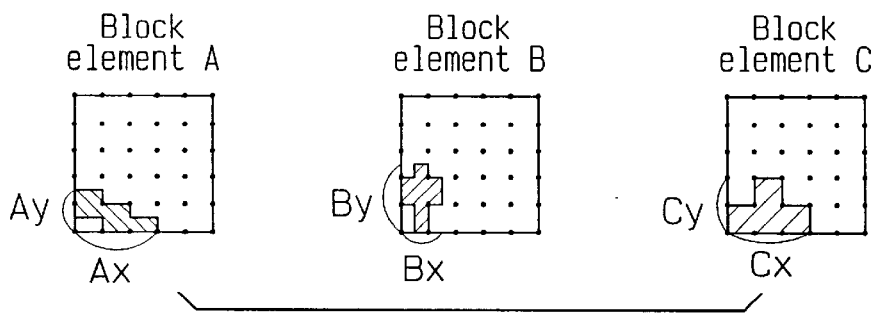
FIGS. 21(a) through 21(c) are additional explanatory diagrams for the third combination of three extracted block elements associated with the flowcharts of FIGS. 18 and 19.
Figure 21:
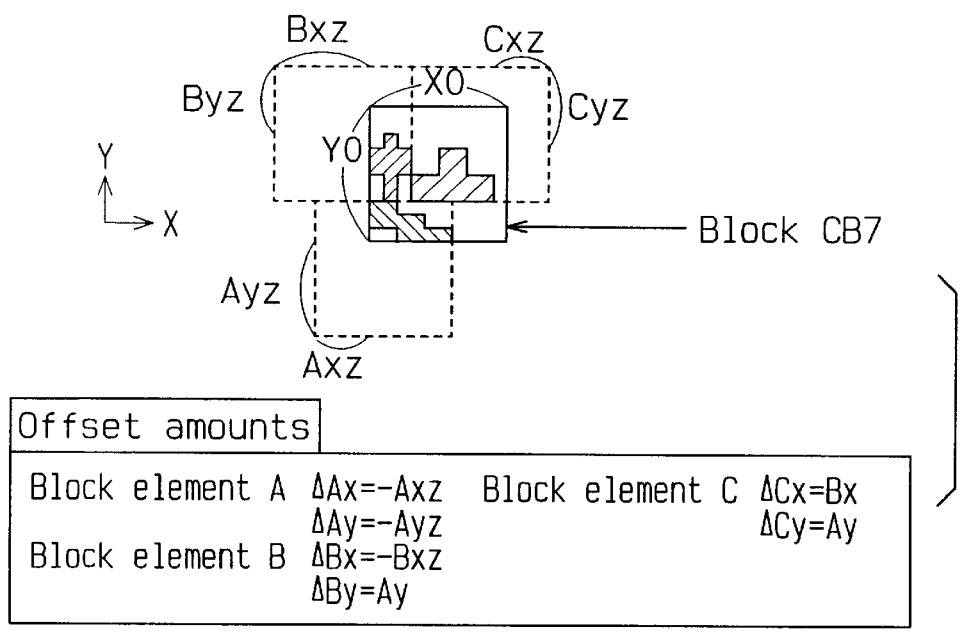
Figure 21:
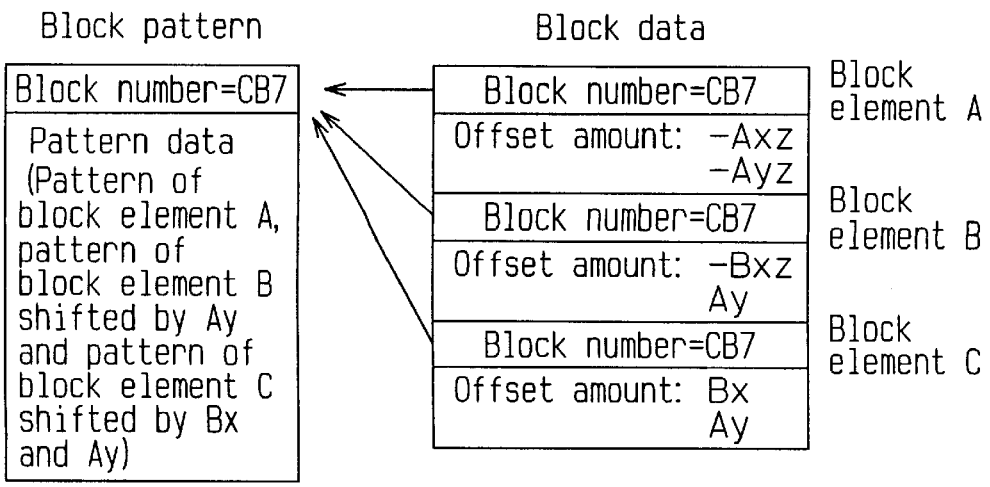

In the next step 180 in FIG. 19, with the coordinates of the lower left corner of the block CB6 in FIG. 20(b) defined as (0, 0), the offset amounts $\Delta Ax$, $\Delta Ay$, $\Delta Bx$, $\Delta By$, $\Delta Cx$ and $\Delta Cy$ are acquired. In step 183, block data shown in FIG. 20(c), or the block pattern data having the block number CB6 and data on the offset amounts affixed thereto, are stored in a file.

Regarding the block elements shown in FIG. 21(a), the result of the determination in step 175 (i.e., whether the sum of Ax and Cx is less than or equal to X0, and Cy is less than or equal to Ay) is NO and therefore the process continues with step 176. It is determined in step 176 whether the sum of the pattern present areas Bx and Cx is less than or equal to the X dimension X0 of a block and if the pattern present area Cy is less than or equal to the pattern present area By. Because the individual block elements in FIG. 21(a) satisfy this condition, it is determined that the block elements B and C can be combined, and the process continues with step 177. In this step 177, the patterns of the block elements A and B are developed as described above.

In the next step 178 shown in FIG. 19, it is checked which block element can be combined with the block element C. As the block element B has been determined to be combinable with the block element C in the previous step 176, the process goes to the next step 181. In step 181, the pattern of the block element C is developed in such a manner that the lower left corner of the pattern of the block element C matches with the position which has the maximum x coordinate of the pattern present area of the block element B and the maximum Y coordinate of the pattern present area of the block element A. As a result of this combination, the pattern of a block CB7 shown in FIG. 21(b) is acquired.

In the next step 182 in FIG. 19, with the coordinates of the lower left corner of the block CB7 in FIG. 21(b) defined as (0, 0), the offset amounts $\Delta AX$, $\Delta Ay$, $\Delta Bx$, $\Delta BY$, $\Delta Cx$ and $\Delta Cy$ are acquired. In step 183, block data shown in FIG. 21(c), or the block pattern data having the block number CB7 and data on the offset amounts affixed thereto, are stored in a file.

In the subsequent step 184, it is determined whether the number "N" of generated blocks has reached the installable number "N0". If the number "N" has not yet reached the installable number "N0", steps 171 to 183 are repeated.

Sixth Combination of Extracted Block Elements

FIGS. 22, 23, 24 and 25 show a still further example in which a block is structured by combining three extracted block elements. First, a first block element A in FIG. 24(a) is acquired in step 191 in FIG. 22, and its pattern present areas Ax and Ay are obtained. In step 192, a second block element B is acquired and its pattern present areas Bx and By are likewise obtained. It is determined in step 193 whether the sum of the pattern present areas Ax and Bx is less than or equal to the X dimension X0 of a block. Because the sum is less than or equal to the X dimension X0 in this example, as apparent from FIGS. 24(a) and 24(b), both block elements A and B are determined to be combinable and the process proceeds to the next step 194.

In step 194, a third block element C is acquired and its pattern present areas Cx and Cy are obtained. It is determined in step 195 whether the sum of the pattern present areas Ay and Cy is less than or equal to the Y dimension Y0 of a block and whether the pattern present area Cx is less than or equal to the pattern present area Ax. Because in this example both are true, it is determined that the block elements A and C can be combined, and the process proceeds to step 197.

In this step 197, the pattern of the block element A is developed so as to be aligned with the lower left corner of a block CB8. The pattern of the block element B is developed in such a manner that the lower left corner of the block element B matches with the position which has the maximum X coordinate and the minimum Y coordinate of the pattern present area of the block element A.

In step 198, it is further checked which block element can be combined with the block element C. Because the block element A has been determined to be combinable with the block element C in the previous step 195, the process goes to the next step 199. In step 199, the pattern of the block element C is developed in such a manner that the lower left corner of the pattern of the block element C matches with the position which has the minimum X coordinate and the maximum Y coordinate of the pattern present area of the block element A. As a result of this combination, the pattern of the block CB8 shown in FIG. 24(b) is acquired.

Figure 23:
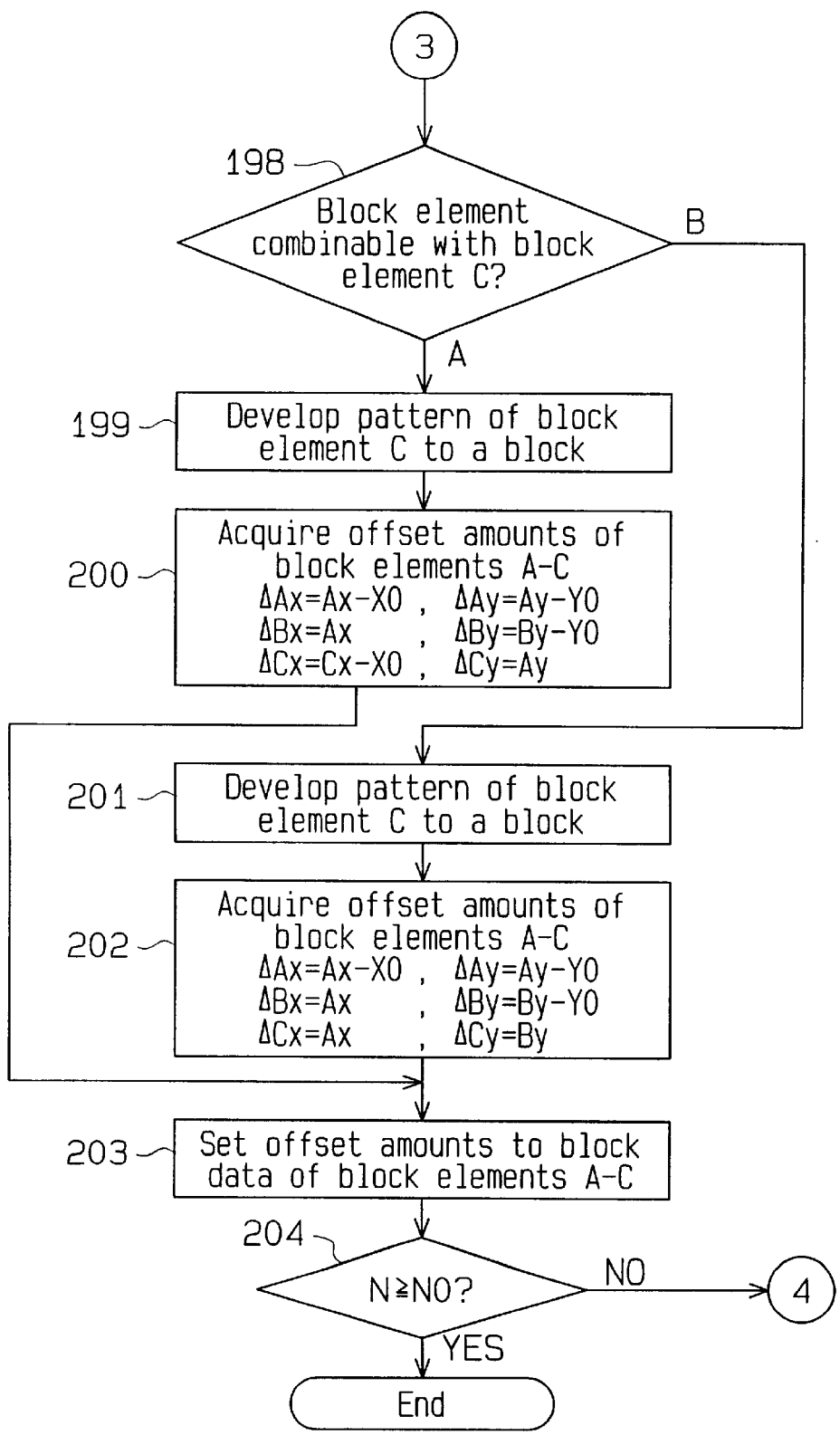
Figure 24A:
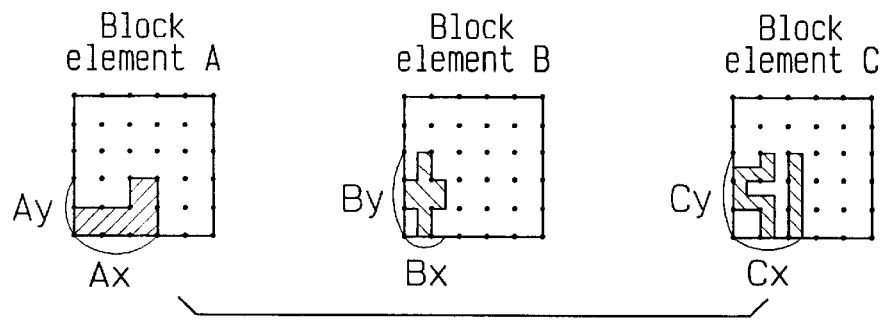
FIGS. 24(a) through 24(c) are explanatory diagrams for the fourth combination of three extracted block elements associated with the flowcharts of FIGS. 22 and 23.
Figure 24B:
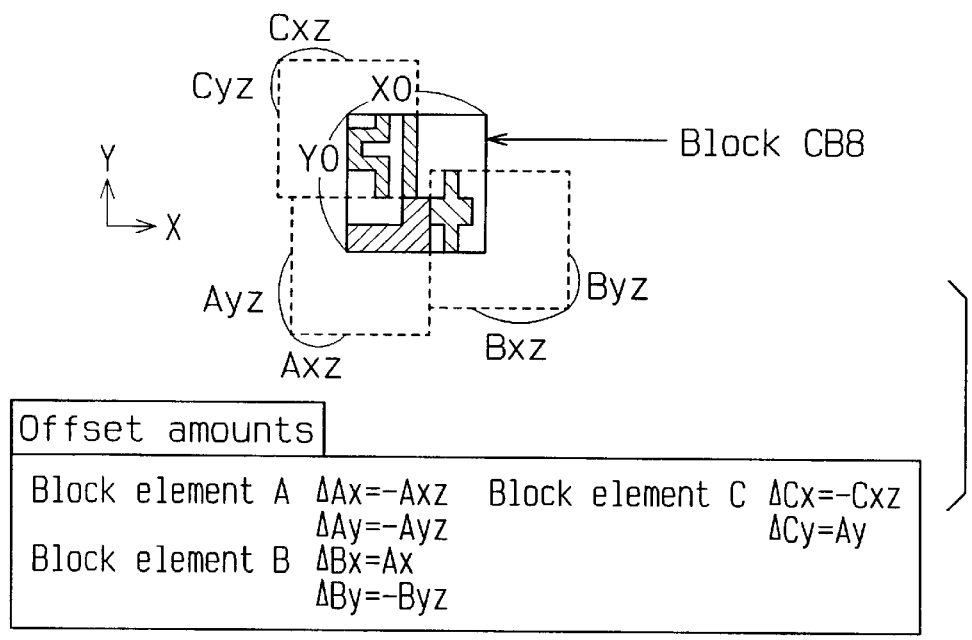
Figure 24C:
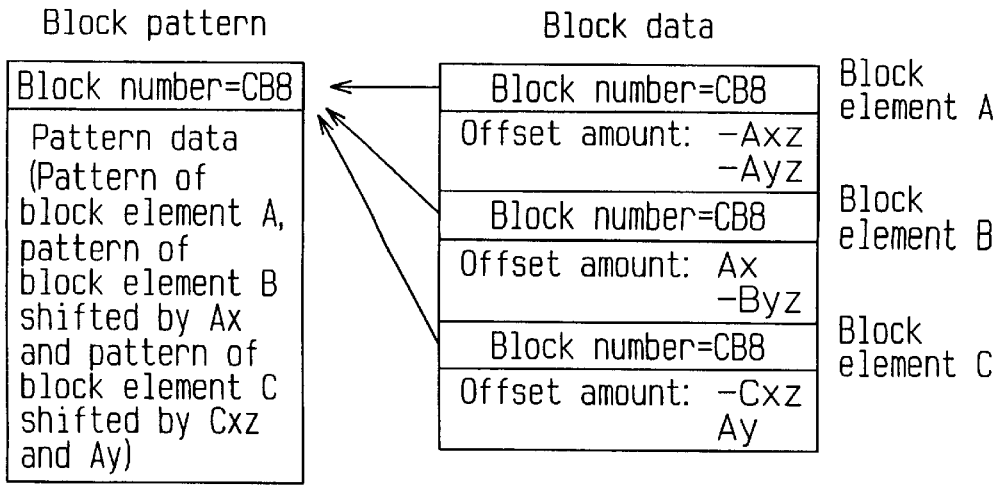

Next, in step 200 in FIG. 23, with the coordinates of the lower left corner of the block CB8 in FIG. 24(b) defined as (0, 0), the offset amounts ΔAx, ΔAy, ΔBx, ΔBy, ΔCx and ΔCy are acquired. In step 203, block data shown in FIG. 24(c), or the block pattern data having the block number CBB and data on the offset amounts affixed thereto, are stored in a file.

Figure 22:
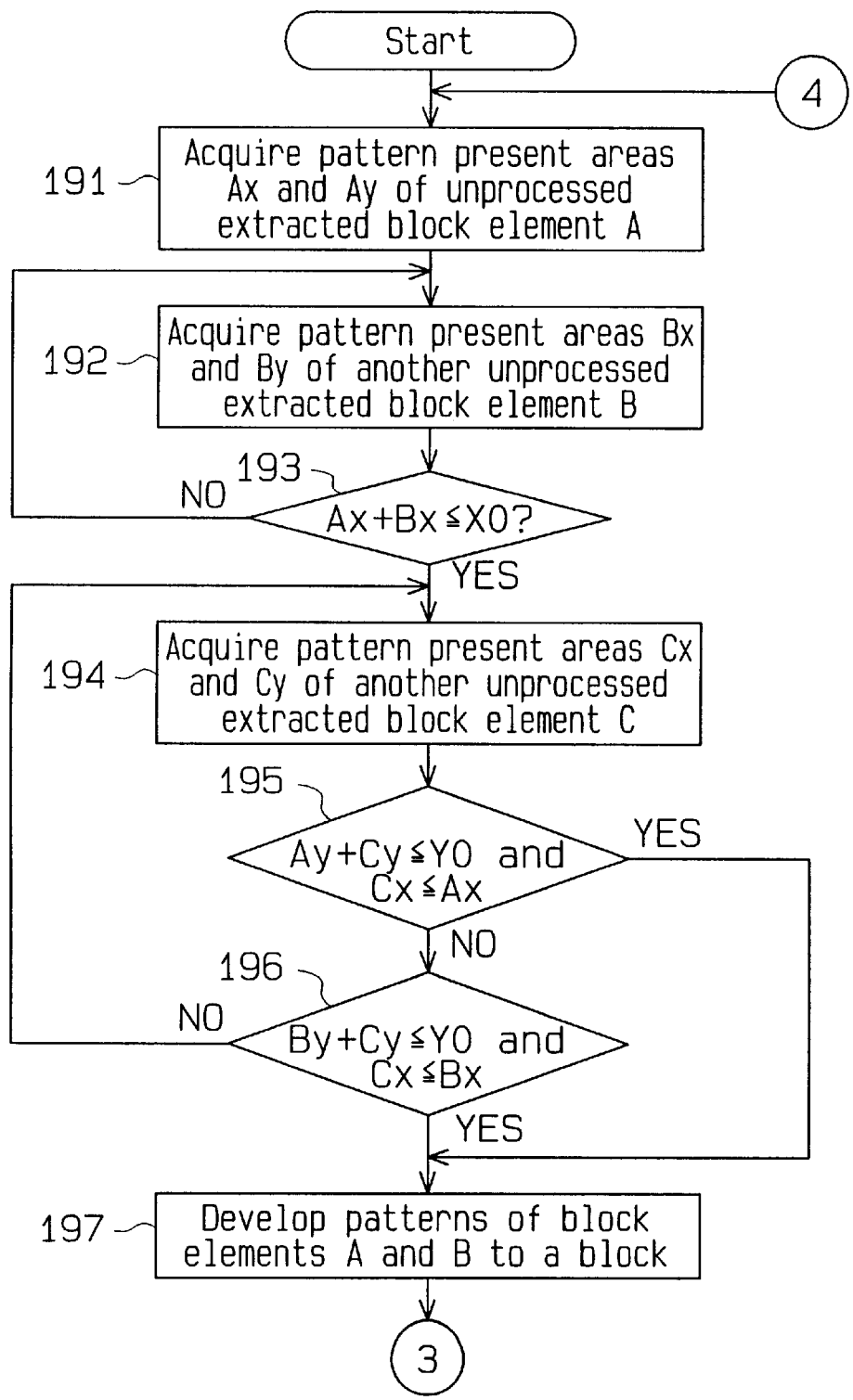
FIGS. 22 and 23 are flowcharts for a fourth combination of three extracted block elements.

When the block elements A, B and C shown in FIG. 25(a) are used, the result of the determination in step 195 in FIG. 22 becomes NO and therefore the process proceeds to step 196. It is determined in step 196 whether the sum of the pattern present areas By and Cy is less than or equal to the Y dimension Y0 of a block and whether the pattern present area Cx is less than or equal to the pattern present area Bx. Because both of these conditions are met in the example in FIG. 25(a), it is determined that the block elements B and C can be combined, and the process proceeds to step 197 where the patterns of the block elements A and B are developed.

Because the block element B has been determined to be combinable with the block element C in the preceding step 196, the determination at step 198 continues the process with step 201. In this step 201, the pattern of the block element C is developed in such a manner that the lower left corner of the pattern of the block element C matches with the position which has the maximum X coordinate of the pattern present area of the block element A and the maximum Y coordinate of the pattern present area of the block element B. As a result of this combination, the pattern of a block CB9 shown in FIG. 25(b) is acquired.

Next, the offset amounts of the block elements A, B and C are acquired in step 202, in substantially the same way as done in the previous case, and block data shown in FIG. 25(c) is set in step 203. If the number "N" of generated blocks is found to be smaller than the installable number "N0" in step 204, steps 191 to 203 are repeated.

Seventh Combination of Extracted Block Elements

Figure 26:
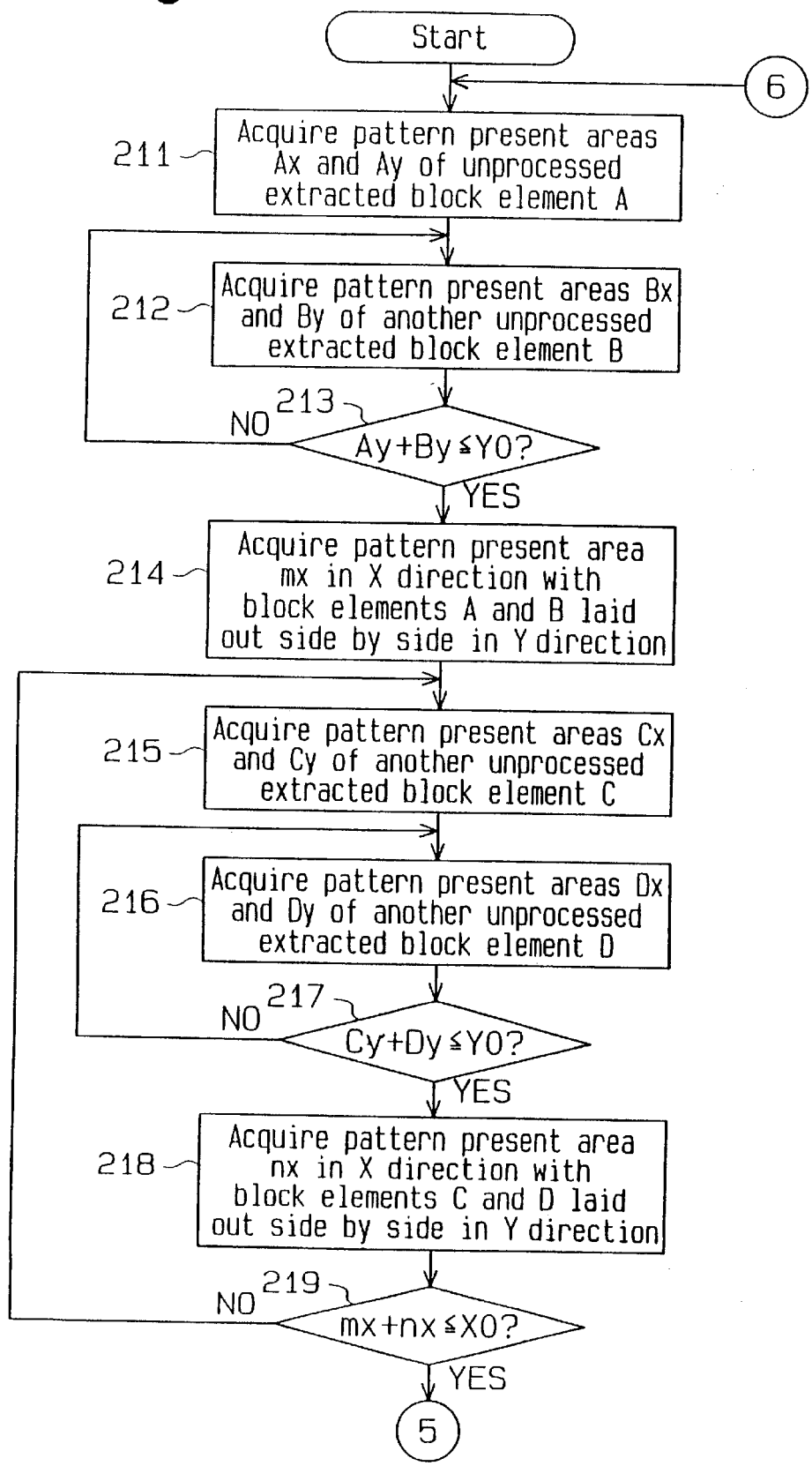
FIGS. 26 and 27 are flowcharts for a first combination of four extracted block elements.
Figure 27:
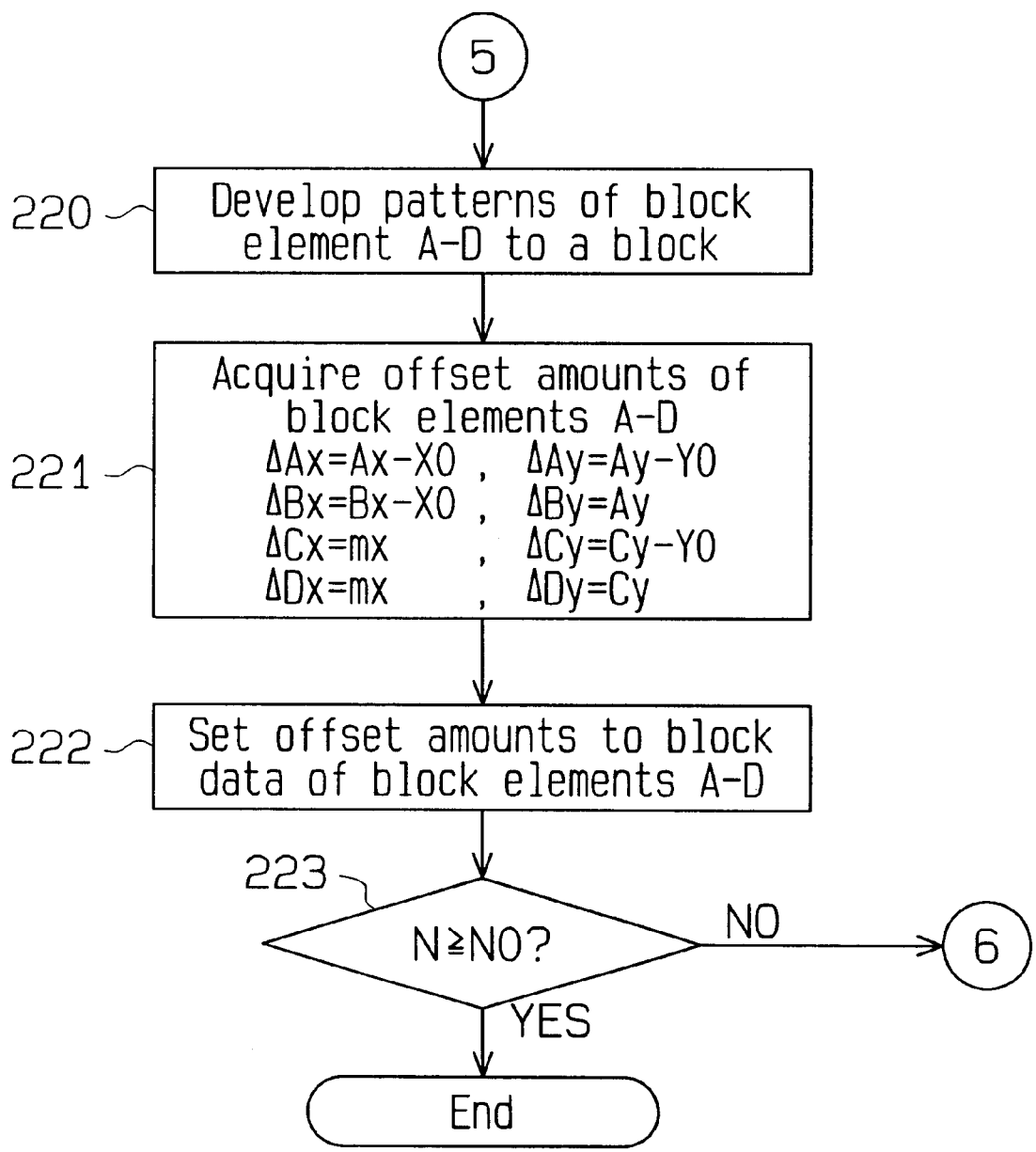

FIGS. 26, 27 and 28 show an example in which a block is structured by combining four extracted block elements. First, a first block element A in FIG. 28(a) is acquired in step 211 in FIG. 26, and its pattern present areas Ax and Ay are obtained. In step 21 2, a second block element B is acquired and its pattern present areas Bx and By are likewise obtained.

It is determined in step 213 whether the sum of the pattern present areas Ay and By is less than or equal to the Y dimension Y0 of a block. Because the sum is less than or equal to the Y dimension Y0 in this example, as apparent from FIGS. 28(a) and 28(b), both block elements A and B are determined to be combinable and the process proceeds to the next step 214. In this step 214, the pattern present area "mx" of a block with the block elements A and B laid side by side in the Y direction, as shown in FIG. 28(b), is obtained.

In the next step 215, a third block element C in FIG. 28(a) is acquired and its pattern present areas Cx and Cy are obtained. In step 216, a fourth block element D is acquired and its pattern present areas Dx and Dy are obtained.

It is determined in step 217 whether the sum of the pattern present areas Cy and Dy is less than or equal to the Y dimension Y0 of a block. Because the sum is less than or equal to the Y dimension Y0 in this example, as apparent from FIGS. 28(a) and 28(b), it is determined that the block elements C and D can be combined, and the process proceeds to the next step 218. In this step 218, the pattern present area "nx" of a block with the block elements C and D laid side by side in the Y direction, as shown in FIG. 28(b), is obtained.

In step 219, it is determined if the sum of the pattern present areas "mx" and "nx" acquired in the previous steps is less than or equal to the X dimension X0 of a block. Because the sum is less than or equal to the X dimension X0 in this example, as apparent from FIGS. 28(a) and 28(b), it is determined that the four block elements, A to D, can be combined, and the process proceeds to the next step 220.

In step 220, the pattern of the block element A is developed so as to be aligned with the lower left corner of a block CB10. The pattern of the block element B is developed in such a manner that the lower left corner of the block element B matches with the position which has the minimum X coordinate and the maximum Y coordinate of the pattern present area of the block element A on the block CB10. Further, the pattern of the block element C is developed in such a manner that the lower left corner of the pattern of the block element C matches with the position which has the maximum X coordinate of the block element A plus block element B on the block CB10 and the minimum Y coordinate of the pattern present area of the block element A on the block CB10. The pattern of the block element D is developed in such a manner that the lower left corner of the pattern of the block element D matches with the position which has the maximum X coordinate of the block element A plus block element B on the block CB10 and the maximum Y coordinate of the pattern present area of the block element C on the block CB10. As a result of this combination, the pattern of the block CB10 shown in FIG. 28(b) is acquired.

In the next step 221, with the coordinates of the lower left corner of the block CB10 in FIG. 28B defined as (0, 0), the offset amounts ΔAx, ΔAy, ΔBx, ΔBy, ΔCx, ΔCy, ΔDx and ΔDy are acquired. In step 222, the block pattern data having the block number CB10 and data on the offset amounts affixed thereto are set and stored in a file as block data shown in FIG. 28(c). If the number "N" of generated blocks is found to be smaller than the installable number "N0" in step 223, steps 211 to 222 are repeated.

Eighth Combination of Extracted Block Elements

Figure 29:
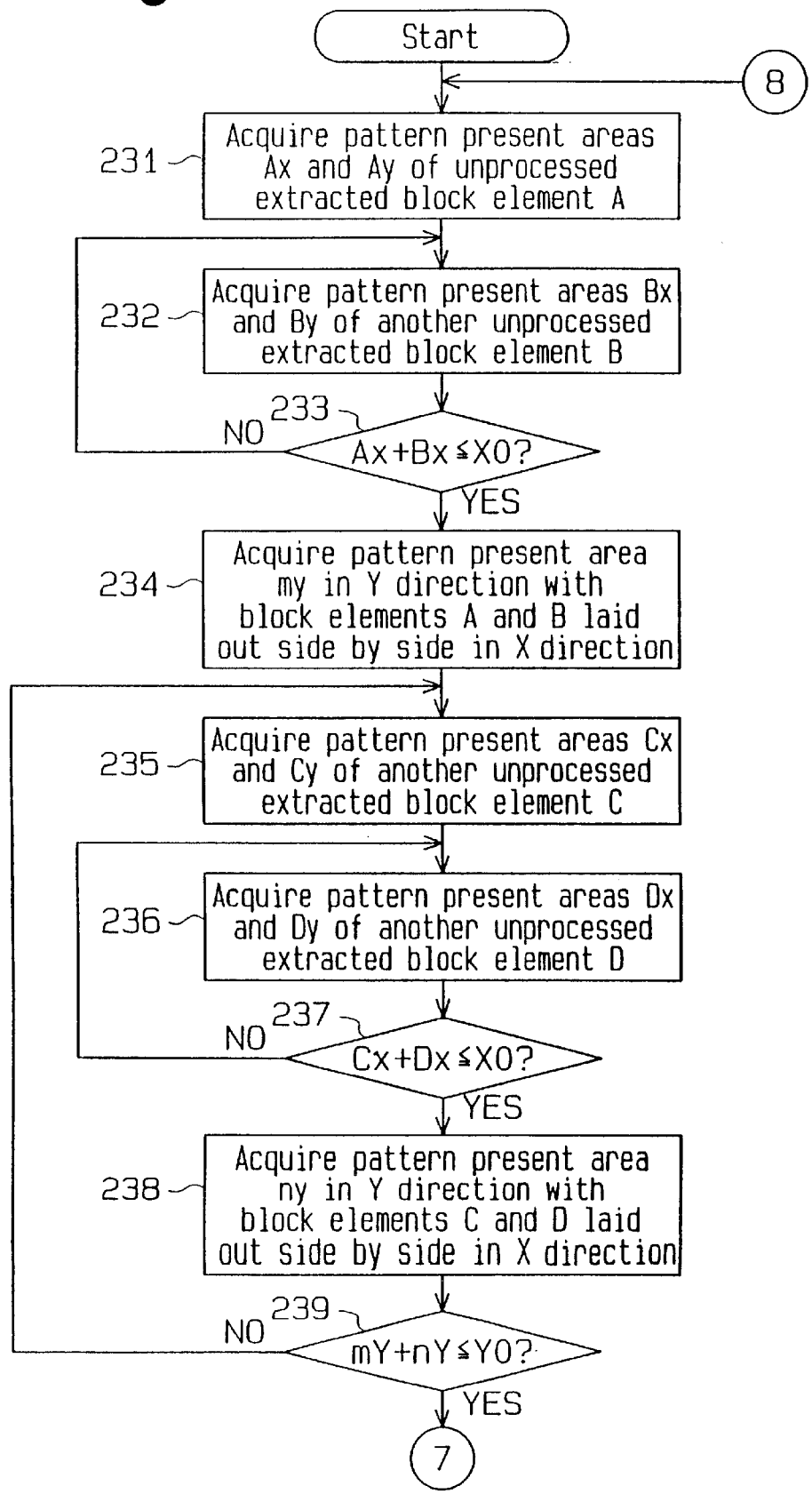
FIGS. 29 and 30 are flowcharts for a second combination of four extracted block elements.
Figure 30:
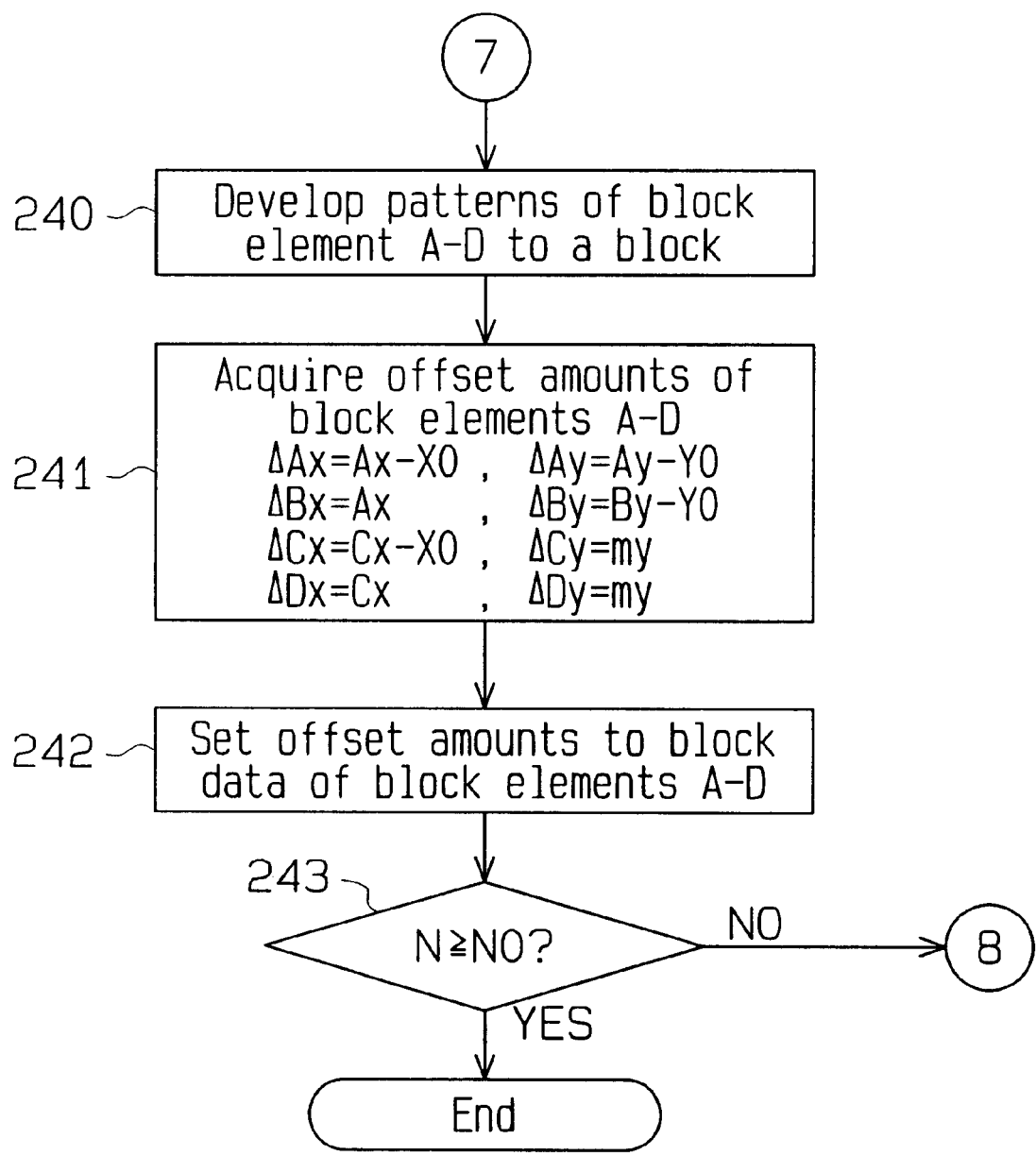
Figure 31:
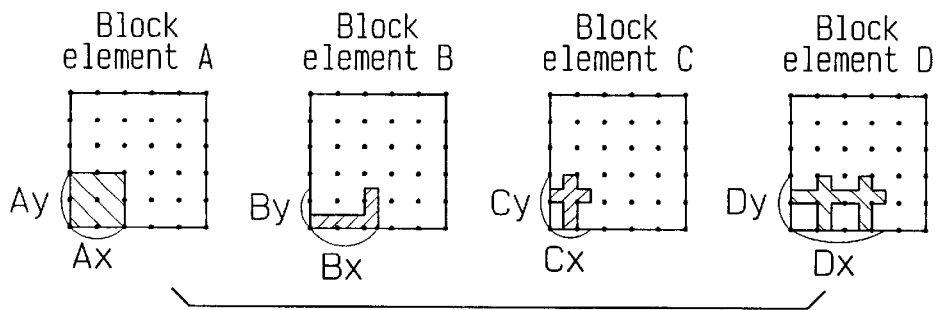
FIGS. 31(a) through 31(c) are explanatory diagrams for the second combination of four extracted block elements associated with the flowcharts of FIGS. 29 and 30.
Figure 31:
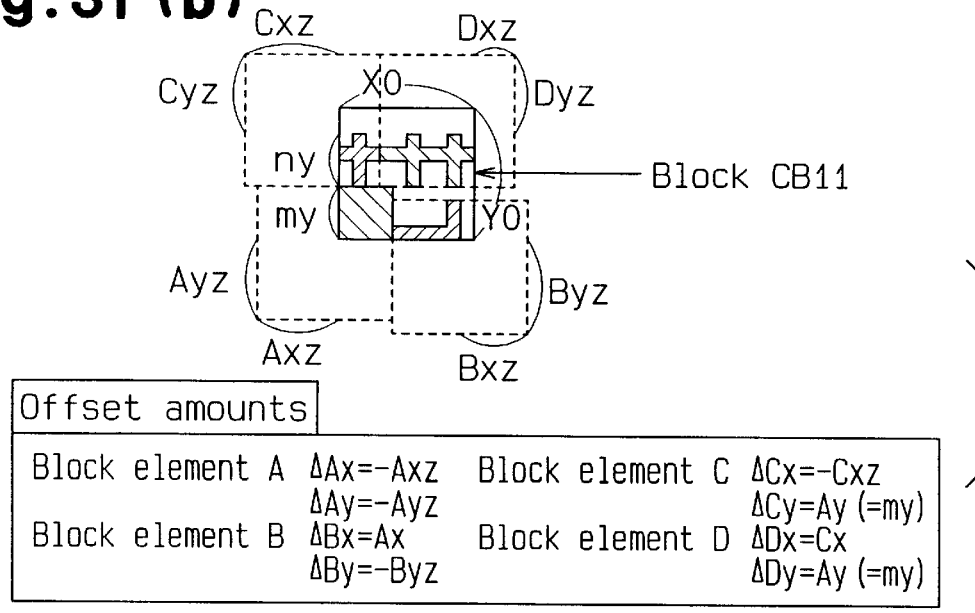
Figure 31:
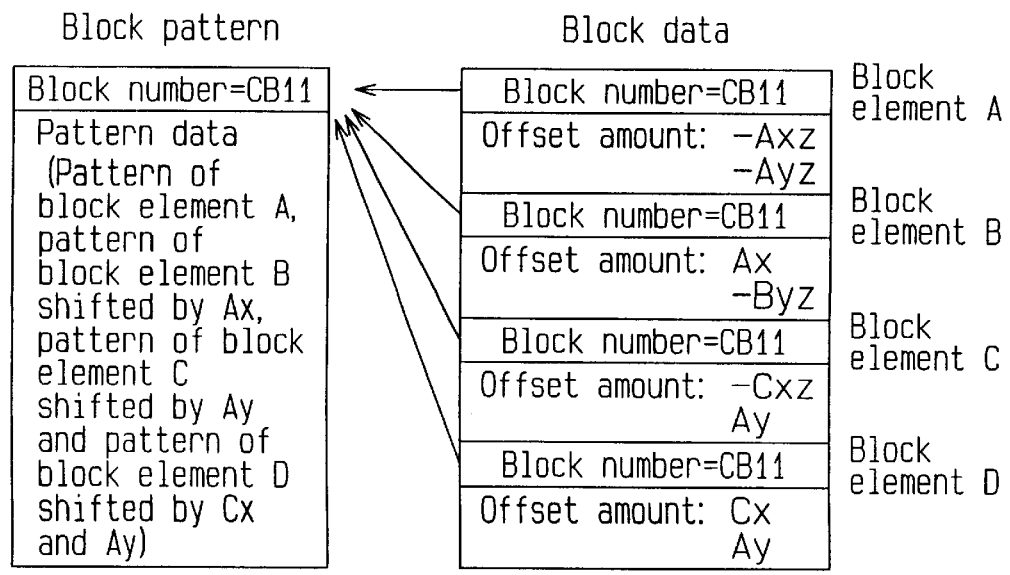

FIGS. 29, 30 and 31 show another example in which a block is structured by combining four extracted block elements. First, a first block element A in FIG. 31(*a*) is acquired in step 231 in FIG. 29, and its pattern present areas Ax and Ay are obtained. In step 232, a second block element B is acquired and its pattern present areas Bx and By are likewise obtained.

It is determined in step 233 whether the sum of the pattern present areas Ax and Bx is less than or equal to the X dimension X0 of a block. Because the sum is less than or equal to the X dimension X0 in this example, as apparent from FIGS. 31(*a*) and 31(*b*), it is determined that both block elements A and B can be combined and the process continues with step 234. In this step 234, the pattern present area "my" of a block with the block elements A and B laid side by side in the X direction, as shown in FIG. 31(*b*), is obtained.

In the next step 235, a third block element C is acquired and its pattern present areas Cx and Cy are obtained. In step 236, a fourth block element D is acquired and its pattern present areas Dx and Dy are obtained.

It is determined in step 237 whether the sum of the pattern present areas Cx and Dx is less than or equal to the X dimension X0 of a block. Because the sum is less than or equal to the X dimension X0 in this example, it is determined that the block elements C and D can be combined, and the process continues with the next step 238. In this step 238, the pattern present area "ny" of a block with the block elements C and D laid side by side in the X direction, as shown in FIG. 31(*b*), is obtained.

In step 239, it is determined if the sum of the pattern present areas "my" and "ny" acquired in the previous steps is less than or equal to the Y dimension Y0 of a block. Because the sum is less than or equal to the Y dimension Y0 in this example, as apparent from FIG. 31(*b*), it is determined that the four block elements can be combined, and the process proceeds to the next step 240.

In step 240, the pattern of the block element A is developed so as to be aligned with the lower left corner of a block CB11. The pattern of the block element B is developed in such a manner that the lower left corner of the block element B matches with the position which has the maximum X coordinate and the minimum Y coordinate of the pattern present area of the block element A on the block CB11.

Further, the pattern of the block element C is developed in such a manner that the lower left corner of the pattern of the block element C matches with the position which has the minimum X coordinate of the block element A on the block CB11 and the maximum Y coordinate of the pattern present area of the block element A plus block element B on the block CB11. The pattern of the block element D is developed in such a manner that the lower left corner of the pattern of the block element D matches with the position which has the maximum X coordinate of the block element C on the block CB11 and the maximum Y coordinate of the pattern present area of the block element A plus block element B on the block CB11. As a result of this combination, the pattern of the block CB11 shown in FIG. 31(*b*) is acquired.

Next, in step 241 in FIG. 30, with the coordinates of the lower left corner of the block CB11 in FIG. 31(*b*) defined as (0, 0), the offset amounts ΔAx, ΔAy, ΔBx, ΔBy, ΔCx, ΔCy, ΔDx and ΔDy are acquired. In step 242, the block pattern data having the block number CB11 and data on the offset amounts affixed thereto are set and stored in a file as block data shown in FIG. 31(*c*).

According to this embodiment, as described above, since the patterns of a plurality of extracted block elements can be placed in a single block on a block mask, it is possible to increase the number of extracted block elements that can be installed on the block mask. This can improve the speed and precision of the exposure, which are the advantages of block exposure, thereby contributing to improvements to the productivity and quality of semiconductor devices.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

I claim:

1. A method for producing at least one block having an exposure pattern on a block mask used for exposing a semiconductor wafer, said block being formed by a plurality of block elements each having a part of the exposure pattern, and said block being formed by installing said block elements on said block mask, said method comprising:

extracting a plurality of said block elements from said exposure pattern, the extracted block elements each having a predetermined pattern existing within a pattern present area of the extracted block element;

forming a combination of the extracted block elements according to the pattern present area of each extracted block element, the combination of the extracted block elements being containable within said block; and arranging the combination of the extracted block elements within said block and changing the mode of said block from a full irradiation mode to a partial irradiation mode.

2. The method according to claim 1, wherein said block and block elements each have a rectangular shape and sizes along an X direction and a Y direction.

3. The method according to claim 2, wherein the extracted block elements to be combined include first and second extracted block elements, and wherein when the sum of the sizes along the X direction of the pattern present areas of the first and second block elements is smaller than the size of the block along the X direction, the patterns of the first and second block elements are arranged within the block.

4. A method according to claim 3, wherein the first and second block elements are arranged by placing the first and second block elements adjacently along the X direction.

5. The method according to claim 2, wherein the extracted block elements to be combined include first and second extracted block elements, and wherein when the sum of the sizes along the Y direction of the pattern present areas of the first and second block elements is smaller than the size of the block along the Y direction, the patterns of the first and second block elements are arranged within the block by placing the first and second block elements adjacently along the Y direction.

6. The method according to claim 2, wherein the extracted block elements to be combined include first, second and third extracted block elements, and wherein when the sum of the sizes of the pattern present areas of the first and second block elements along the Y direction is smaller than the size along the Y direction of the block and when the sum of the size along the X direction of the pattern present areas of the first and second block elements arranged along the Y direction and the size along the X direction of the pattern present area of the third block element is smaller than the size of the block along the X direction, the patterns of the first, second and third block elements are arranged within the block by placing the first and second block elements adjacently along the Y direction and further placing the third block element adjacently along the X direction.

7. The method according to claim 2, wherein the extracted block elements to be combined include first, second and third extracted block elements, and wherein when the sum of the sizes of the pattern present areas of the first and second block elements along the X direction is smaller than the size of the block along the X direction and when the sum of the size along the Y direction of the pattern present areas of the first and second block elements arranged along the X direction and the size of the pattern present area of the third block element along the Y direction is smaller than the size of the block along the Y direction, the patterns of the first, second and third block elements are arranged within the block by placing the first and second block elements adjacently along the X direction and further placing the third block element adjacently along the Y direction.

8. The method according to claim 2, wherein the extracted block elements to be combined include first, second and third block elements, and wherein when the sum of the size along the Y direction of the pattern present areas of the first and second block elements is smaller than the size of the block along the Y direction, the sum of the size along the X direction of the pattern present area of one of the first and the second block elements and the size along the X direction of the pattern present area of the third block element is smaller than the size of the block along the X direction, and the size along the Y direction of the pattern present area of the third block element is smaller than the size along the Y direction of the pattern present area of the one of the first and the second block elements, the patterns of the first, second and third block elements are arranged within the block by placing the first and second block elements along the Y direction and further placing the third block element together with the one of the first and second block elements along the X direction.

9. The method according to claim 2, wherein the extracted block elements to be combined include first, second and third block elements, and wherein when the sum of the size along the X direction of the pattern present areas of the first and second block elements is smaller than the size of the block along the X direction, the sum of the size along the Y direction of the pattern present area of one of the first and the second block elements and the size along the Y direction of the pattern present area of the third block element is smaller than the size of the block along the Y direction, and the size along the X direction of the pattern present area of the third block element is smaller than the size along the X direction of the pattern present area of the one of the first and the second block elements, the patterns of the first, second and third block elements are arranged within the block by placing the first and second block elements along the X direction and further placing the third block element together with the one of first and second block elements along the Y direction.

10. The method according to claim 2, wherein the extracted block elements to be combined include first, second, third and fourth block elements, when the sum of the sizes along the Y direction of the pattern present areas of the first and second block elements is smaller than the size of the block along the Y direction, the sum of the size along the Y direction of the pattern present areas of the third and fourth block elements is smaller than the size of the block along the Y direction, and when the sum of the size along the X direction of the pattern present areas of the first and second block elements arranged along the Y direction and the size along the X direction of the pattern existing areas of the third and fourth block elements arranged along the Y direction is smaller than the size of the block along the X direction, the patterns of the first, second, third and fourth block elements are arranged within the block by placing, along the X direction, the arrangement along the Y direction of the first and second block elements and the arrangement along the Y direction of the third and fourth block elements.

11. The method according to claim 2, wherein the extracted block elements to be combined include first, second, third and fourth block elements, and wherein when the sum of the sizes along the X direction of the pattern present areas of the first and second block elements is smaller than the size of the block along the X direction, the sum of the sizes along X direction of the pattern present areas of the third and fourth block elements is smaller than the size of the block along the X direction, and when the sum of the size along the Y direction of the pattern present areas of the first and second block elements arranged along the X direction and the size along the Y direction of the pattern existing areas of the third and fourth block elements arranged along the X direction is smaller than the size of the block along the Y direction, the patterns of the first, second, third and fourth block elements are arranged within the block by placing along the Y direction the arrangement along the X direction of the first and second block elements and the arrangement along the X direction of the third and fourth block elements.

12. An apparatus for executing the method according to claim 1, wherein said apparatus includes:

a memory device for storing information regarding the exposure pattern; and a controller for executing the extracting step, the forming step and the arranging step in response to the information stored in said memory device.

13. A computer readable medium for storing computer instructions used for producing at least one block having an exposure pattern on a block mask used for exposing a semiconductor wafer, said block being formed by a plurality of block elements each having a part of the exposure pattern, and said block being formed by arranging said block elements on said block mask, said computer readable medium comprises:

computer instructions for extracting a plurality of said block elements from said exposure pattern, the extracted block elements each having a predetermined pattern existing within at least a partial area of the extracted block element referred to as a pattern present area;

computer instructions for forming a combination of the extracted block elements according to the pattern present area of each extracted block element, the combination of the extracted block elements being containable within said block; and computer instructions for arranging the combination of the extracted block elements within said block.

14. A computer readable medium as recited in claim 13, wherein said computer readable medium further comprises:

computer instructions for changing an exposure type for said block from a full irradiation type to a partial irradiation type.

15. An exposure method using a block mask having a plurality of blocks, at least one of the plurality of blocks including a plurality of block elements, which are independently used for two or more block exposure processes, the method comprising the steps of:

calculating a coordinate value of selecting an irradiating position of at least one of the plurality of blocks;

calculating an offset value for selecting one of the plurality of block elements in the at least one of the plurality of blocks; and adding the coordinate value with the offset value to specify an exposure target block element based on the added value.

* * * * *